(12) United States Patent
Silsby et al.

(10) Patent No.: US 7,728,271 B2
(45) Date of Patent: Jun. 1, 2010

(54) PIXEL WITH SPATIALLY VARYING SENSOR POSITIONS

(75) Inventors: Christopher D. Silsby, Albany, OR (US); William G. Gazeley, Corvallis, OR (US); Matthew M. Borg, Albany, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/202,666

(22) Filed: Sep. 2, 2008

(65) Prior Publication Data

US 2009/0057537 A1 Mar. 5, 2009

Related U.S. Application Data

(60) Division of application No. 11/256,743, filed on Oct. 24, 2005, now Pat. No. 7,432,491, which is a continuation-in-part of application No. 11/123,782, filed on May 6, 2005, now Pat. No. 7,214,920.

(51) Int. Cl.
*H01L 31/062* (2006.01)

(52) U.S. Cl. .............. 250/208.1; 250/214 R; 257/184

(58) Field of Classification Search .............. 250/208.1, 250/214.1; 257/291, 184, 187, 203, 292, 257/293, 433, 461, 462, 929
See application file for complete search history.

(56) References Cited

U.S. PATENT DOCUMENTS

| | | | |
|---|---|---|---|
| 5,504,355 A | 4/1996 | Hatano | |
| 5,576,763 A | 11/1996 | Ackland et al. | |
| 5,841,126 A | 11/1998 | Fossum et al. | |
| 5,920,345 A | 7/1999 | Sauer | |
| 5,990,850 A | 11/1999 | Brown et al. | |
| 6,057,586 A | 5/2000 | Bawolek et al. | |

(Continued)

FOREIGN PATENT DOCUMENTS

GB 2 425 887 A 11/2006

(Continued)

OTHER PUBLICATIONS

British Search Report Appln. No. GB0620151.1, dated Feb. 27, 2007.

(Continued)

*Primary Examiner*—Georgia Y Epps
*Assistant Examiner*—Tony Ko
(74) *Attorney, Agent, or Firm*—RatnerPrestia

(57) ABSTRACT

An image sensor including a substrate, at least one metal layer, and a plurality of pixels arranged in array. Each pixel includes a sense element disposed in the substrate and at least one metal interconnect segment disposed in the at least one metal layer. The array includes a pair of perpendicular axes extending from an optical center, wherein for a line of pixels extending perpendicularly from one of the axes to a peripheral edge of the array a spacing between the sense elements of consecutive pairs of pixels of the line is at least equal to a spacing between the associated at least one metal interconnect segments, and wherein for at least one consecutive pair of pixels of the line the spacing between the sense elements is greater by an incremental amount than the spacing between the corresponding at least one metal interconnect segments.

4 Claims, 16 Drawing Sheets

U.S. PATENT DOCUMENTS

| | | |
|---|---|---|
| 6,194,770 B1 | 2/2001 | Zarnowski et al. |
| 6,225,670 B1 | 5/2001 | Dierickx |
| 6,235,549 B1 | 5/2001 | Bawolek et al. |
| 6,278,169 B1 | 8/2001 | Sayuk et al. |
| 6,288,434 B1 | 9/2001 | Levy |
| 6,352,869 B1 | 3/2002 | Guidash |
| 6,369,417 B1 | 4/2002 | Lee |
| 6,376,868 B1 | 4/2002 | Rhodes |
| 6,466,266 B1 | 10/2002 | Guidash et al. |
| 6,555,842 B1 | 4/2003 | Fossum et al. |
| 6,570,617 B2 | 5/2003 | Fossum et al. |
| 6,642,965 B1 | 11/2003 | Nagata et al. |
| 6,744,068 B2 | 6/2004 | Fossum et al. |
| 6,777,662 B2 | 8/2004 | Drowley et al. |
| 6,815,787 B1 | 11/2004 | Yaung et al. |
| 6,838,715 B1 * | 1/2005 | Bencuya et al. ............. 257/291 |
| 6,861,686 B2 | 3/2005 | Lee et al. |
| 6,930,299 B2 | 8/2005 | Ohkawa |
| 7,138,618 B2 | 11/2006 | Mishina |
| 2001/0026322 A1 | 10/2001 | Takahashi et al. |
| 2003/0103150 A1 | 6/2003 | Catrysse et al. |
| 2004/0017492 A1 * | 1/2004 | Stavely .................... 348/240.2 |
| 2006/0104564 A1 | 5/2006 | Catrysse |

FOREIGN PATENT DOCUMENTS

| | | |
|---|---|---|
| JP | 2003-273342 | 9/2003 |
| JP | 2006-303468 | 11/2006 |

OTHER PUBLICATIONS

Peter B. Catrysse et al. "Optical Efficiency of Image Sensor Pixels," Optical Society of America, vol. 19, No. 8, Aug. 2002, pp. 1601-1620.

Peter B. Catrysse et al. "Integrated Color Pixels in 0.18-um Complementary Metal Oxide Semiconductor Technology," Optical Society of America, vol. 20, No. 12, Dec. 2003, pp. 2293-2306.

Dun-Nian Yaung et al., "Air-Gap Guard Ring for Pixel Sensitivity and Crosstalk Improvement in Deep Sub-micron CMOS Image Sensor," IEEE 2003, pp. 16.5.1-16.5.4.

* cited by examiner

PIXEL WITH SPATIALLY VARYING SENSOR POSITIONS

CROSS-REFERENCE TO RELATED APPLICATIONS

This application is a divisional of U.S. patent application Ser. No. 11/256,743, filed Oct. 24, 2005, now U.S. Pat. No. 7,432,491 which is a Continuation-in-part Application of application Ser. No. 11/123,782, filed May 6, 2005 now U.S. Pat. No. 7,214,920 and the content of these applications is incorporated herein by reference.

BACKGROUND

Solid-state image sensors (also known as "solid-state imagers," "image sensors," and "imagers") have broad applications in many areas and in a number of fields. Solid-state image sensors convert a received image into a signal indicative of the received image. Examples of solid-state image sensors include charge coupled devices (CCD), photodiode arrays, and complementary metal-oxide semiconductor (CMOS) imaging devices (also known as "CMOS image sensors" or "CMOS imaging arrays").

Solid-state image sensors are fabricated from semiconductor materials, such as silicon or gallium arsenide, and comprise imaging arrays of light detecting (i.e., photosensitive) elements (also known as "photodetectors" or "photoreceptors") interconnected to generate analog signals representative of an image illuminating the device. A typical imaging array comprises a number of photodetectors arranged into rows and columns, each photodetector generating photo-charges. The photo-charges are the result of photons striking the surface of the semiconductor material of the photodetector, and generating free charge carriers (electron-hole pairs) in an amount linearly proportional to the incident photon radiation. The photo-charges from each pixel are converted to a charge signal which is an electrical potential representative of the energy level reflected from a respective portion of the object and received by the solid-state image sensor. The resulting signal or potential is read and processed by video/image processing circuitry to create a signal representation of the image.

In recent years, CMOS image sensors have become a practical implementation option for imagers and provide cost and power advantages over other technologies such as CCD or charge injection device (CID). A conventional CMOS image sensor is typically structured as an imaging array of pixels, each pixel including a photodetector and a transistor region, and as discussed above, each pixel converts the incoming light into an electronic signal.

One type of active pixel design for a CMOS image sensor, often referred to as a pinned-diode pixel, includes four wires (or "metal interconnect lines" or "metal interconnect segments"), a photodetector (i.e. a photodiode), and three transistors, namely a reset transistor, a source-follower transistor, and an access transistor (or "transfer gate"). The photodiode and transistors are located in active areas of a silicon substrate that forms a floor to the pixel. Two of the metal interconnect segments are disposed in a first metal layer (generally referred to as metal-1), which is positioned above a poly-silicon layer formed on the silicon substrate, and provide reset and access ("transfer") signals to the pixel.

The two remaining metal interconnect segments disposed perpendicularly to the first two metal interconnect segments in a second metal layer (generally referred to as metal-2), which is positioned above a dielectric insulation layer over the first metal layer, and provide power and column selection to the pixel. Conductive contacts couple the metal-1 layer to the poly-silicon layer and to the active areas of the silicon substrate, and conductive vias couple the metal-2 layer to the metal-1 layer. The contacts and via enable the metal interconnect segments to be in electrical communication with one another and with the poly-silicon layer and silicon substrate of the pixel. In a typical three-transistor active pixel design for a CMOS image sensor, each pixel includes four wires (or "metal interconnect lines" or "metal interconnect segments") and three transistors, namely, a reset transistor, a source-follower transistor, and a select transistor. Two metal interconnect segments are disposed horizontally to provide row selection for either resetting the pixel or reading the pixel. Two other metal interconnect segments are disposed vertically (or substantially perpendicular to the first two metal interconnect segments) to provide column selection for both reading and resetting the pixel.

In conventional CMOS image sensors, the arrangement of the pixel's structures, including the relative positioning of the photodetector, the transistor region, and the metal interconnect segments, as well other structural elements, has presented problems. A major problem which conventional CMOS image sensors exhibit is pixel light shadowing (also referred to as "geometric shadowing"). Pixel light shadowing is caused when the average ray or principal ray striking the pixel deviates significantly from normal (or perpendicular to the imaging array plane). Under these conditions, one or more of the pixel elements situated in metal layers above the photodetector may block a significant amount of light from being directed at the photodetector. As a result, the brightness of the resulting image can be significantly reduced, resulting in poor image quality

SUMMARY

In one aspect, the present invention provides an image sensor including a substrate, at least one metal layer, and a plurality of pixels arranged in array. Each pixel includes a sense element disposed in the substrate and at least one metal interconnect segment disposed in the at least one metal layer. The array includes a pair of perpendicular axes extending from an optical center, wherein for a line of pixels extending perpendicularly from one of the axes to a peripheral edge of the array a spacing between the sense elements of consecutive pairs of pixels of the line is at least equal to a spacing between the associated at least one metal interconnect segments, and wherein for at least one consecutive pair of pixels of the line the spacing between the sense elements is greater by an incremental amount than the spacing between the corresponding at least one metal interconnect segments.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
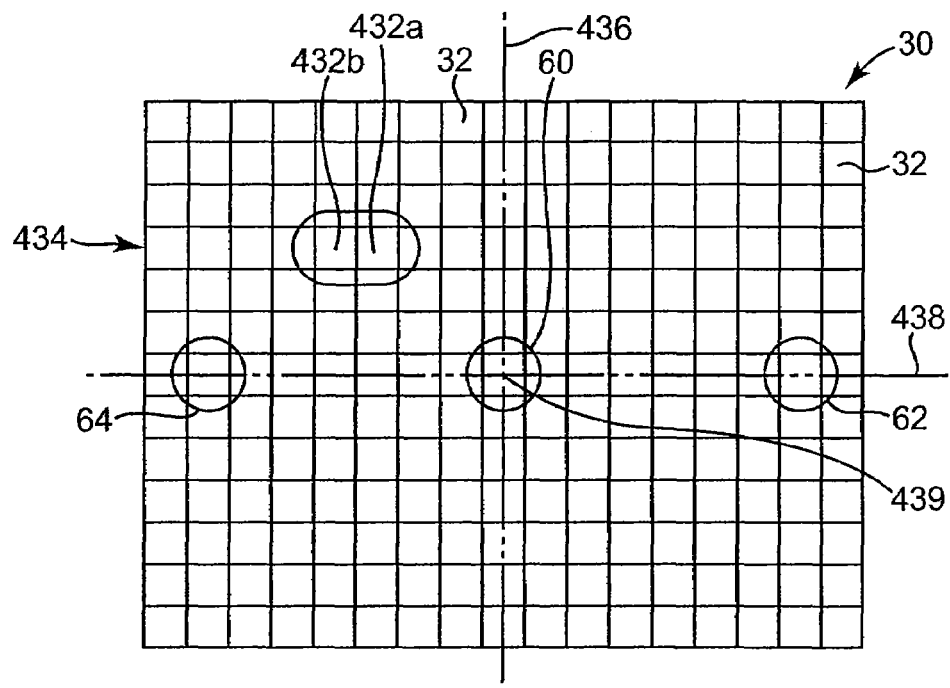
FIG. 1 is a block diagram illustrating generally a CMOS imaging array.

FIG. 1 is a block diagram illustrating generally a CMOS imaging array 30 including a plurality of pixels 32 arranged in a plurality of rows and columns, with each pixel 32 generating photo-charges from received light representative of an image. The photo-charges generated by pixels 32 are the result of photons striking the surface of a semiconductor material, or photodetector (e.g. photodiode and photogate), and generating free charge carriers (i.e. electron hole pairs) in an amount linearly proportional to the incident photon radiation. As will be described in greater detail below, each pixel 32 includes metallic interconnect segments and vias that can be shifted based on their position relative to an optical center of array 30, in accordance with the present invention, so as to increase the photon radiation incident upon the semiconductor material.

Figure 2:
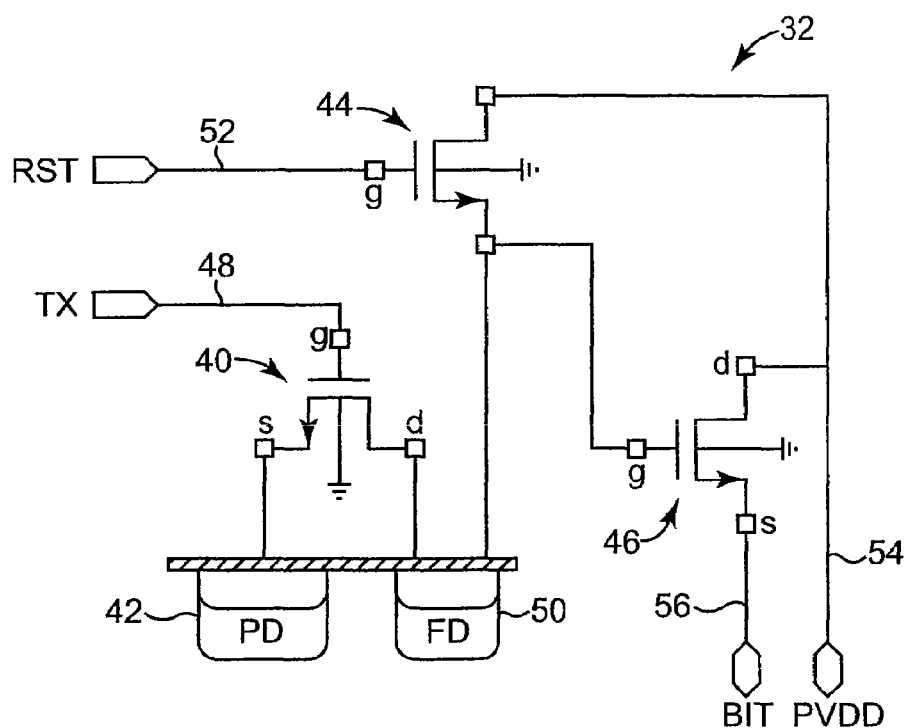
FIG. 2 is a block and schematic diagram illustrating a pixel of the CMOS imaging array of FIG. 1.

FIG. 2 is a schematic diagram illustrating one example configuration of a pixel 32, commonly referred to as a buried-gated photodiode type pixel. Pixel 32 includes a photodetector 42, an access transistor 40 (often referred to as a "transfer gate"), a reset transistor 44, and a source follower transistor 46. The gate of transfer gate 40 is coupled to an access or transfer (TX) line 48, the source is coupled to photodiode (PD) 42, and the drain is coupled to a floating diffusion region (FD) 50. The gate of reset transistor 44 is coupled to a reset (RST) line 52, the source is coupled to FD 50, and the drain is coupled to a voltage line (PVDD) 54. The gate of source-follower transistor 46 is coupled to the source of reset transistor 44, the source is coupled to a column or bit (BIT) line 56, and the drain is coupled to PVDD 54. Although only one pixel 32 is illustrated, TX, RST lines 48, 52 extend across all pixels of a given row of array 30, and PVDD and BIT lines 54, 56 extend across all pixels of a given column of array 30.

Pixel 32 operates in two modes, integration and readout, based on signals received via TX 48 and RST lines 48, 52. Initially, pixel 32 is in a reset state with transfer gate 48 and reset transistor 52 turned on. To begin integrating, reset transistor 52 and transfer gate 48 are turned off. During the integration period, PD 42 accumulates a photo-generated charge that is proportional to the photon radiation that propagates through portions of pixel 32 and is incident upon photodetector 42.

After pixel 32 has integrated for a desired time period, reset transistor 44 is turned on and the reset level of FD 50 is sampled at BIT line 56 via source-follower transistor 46. Subsequently, transfer gate 40 is turned on and the accumulated charge is transferred from PD 42 to FD 50. The charge transfer causes the potential of FD 50 to deviate from the reset value, which is approximately equal to the level of PVDD line 54 minus a threshold voltage, to a signal value which is depends on the accumulated charge. The signal value is then sampled, or read, at BIT line 56 via source-follower transistor 46. The difference between the sampled signal value and the sampled reset value constitutes an image signal for pixel 32 and is proportional to the intensity of the light incident upon PD 42.

Following readout of the row of pixels in which pixel 32 is located, FD 50 is returned to ground to turn off source-follower transistor 46. Because all source-follower transistors of the pixels of each column constitute a wired- or circuit, returning FD 50 to ground ensures that only one source-follower transistor at a time will be turned on in a given column. FD 50 is returned to ground by temporarily driving PVDD 54 to a low voltage level (typically ground) and then pulsing RST 52 high which, in-turn, sets the floating diffusion area of each pixel in a given row (such as FD 50) to the voltage level of PVDD 54 (which as described above, has previously been driven to ground).

Figure 3:
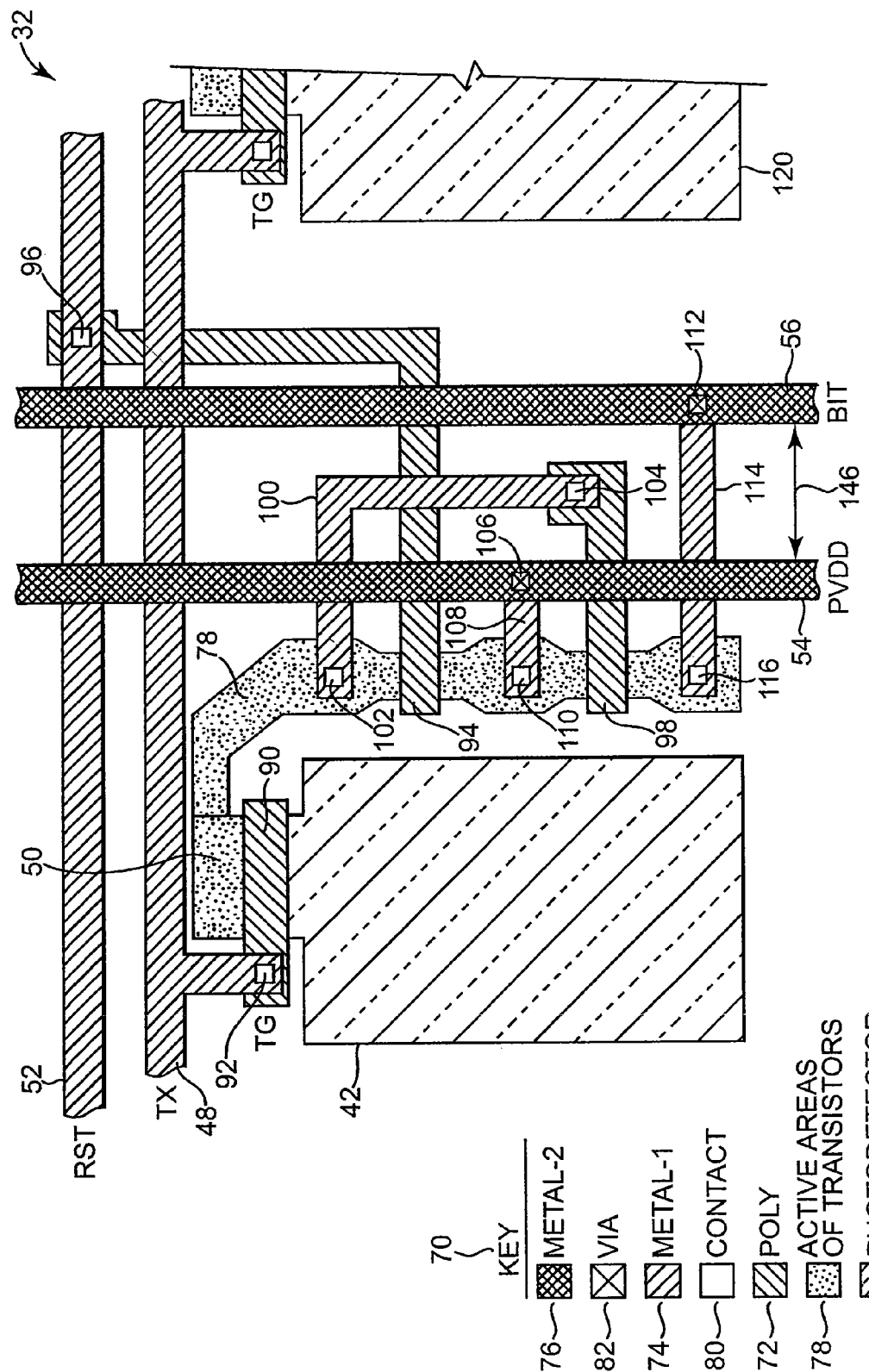
FIG. 3 is an example layout of the pixel of FIG. 2 according to the present invention.

FIG. 3 illustrates an example layout of pixel 32 as illustrated by FIG. 2 when located in a region 60 (see FIG. 2) which is proximate to an optical center of array 30. The elements of pixel 32 are disposed in various layers which overlay a silicon substrate which forms the "floor" of pixel 32. In the illustrated example, with reference to drawing key 70, pixel 32 includes a polysilicon layer ("poly") 72 overlaying the silicon substrate, a first metal layer ("metal-1") 74 positioned above poly 72, and a second metal layer (metal-2) 76 positioned above poly 72. Dielectric insulation layers (not illustrated) are positioned between poly 72 and metal-1 74, and between metal-1 74 and metal-2 76. Pixel 32 includes additional material layers which, for ease of illustration, are not described or discussed herein.

PD 42, FD 50, and active areas 78 of the transistors are disposed in active regions (i.e. doped regions) of the silicon substrate. Contacts, illustrated at 80 provide conductive pathways to couple metal-1 74 to active areas 78 of the transistors, and to couple metal-1 74 to poly 72. Vias, indicated at 82, provide conductive pathways to couple metal-2 76 to metal-1 74.

TX and RST lines 48, 52 are disposed in metal-1 74 and PVVD and BIT lines 54, 56 are disposed in metal-2 76 and respectively extend horizontally and vertically (with respect to FIG. 3) across pixel 32. A segment 90 of poly 74 is positioned over PD 42 and FD 50 to form the gate of transfer gate 40. TX line 48 is coupled to segment 90 of poly 72 via a contact 92. A segment 94 of poly 72 is positioned over active area 78 to form the gate of reset transistor 44, and extends and is coupled to RST line 52 by contact 96. A segment 98 of poly 72 is positioned over active area 78 to form the gate of source-follower transistor 46. A first end of a segment 100 of metal-1 74 is coupled by a contact 102 to the source of reset transistor 44 in active area 78, and a second end is coupled by a contact 104 to segment 98 of poly 72, thereby coupling the source of reset transistor 44 to the gate of source-follower transistor 46. The source of reset transistor 44 is coupled to FD 50 via active area 78.

PVDD line 54 is coupled by a via 106 to a first end of a segment 108 of metal-1 74 which, in-turn, is coupled at a second end to the drains of reset and source-follower transistors 44, 46 by a contact 110. BIT line 56 is coupled by a via 112 to a first end of a segment 114 of metal-1 74 which, in-turn, is coupled at a second end to the source of source-follower transistor 46 by a contact 116. The photodetector of an adjacent pixel is illustrated at 120.

It is noted that FIG. 3 is included for illustrative purposes only and is not drawn to scale. As such, element sizes, spacing between elements, and relative position of elements with respect to one another have been exaggerated for ease of illustration and are not intended to exactly represent actual pixel structures.

It should also be noted that vias (e.g. vias 106 and 112) and contacts (e.g. 96, 102, 104, etc.) can be generally described as interlayer connect elements. As the name suggests, such interlayer connect elements function as "conduits" to electrically couple non-contacting layers to one another. The terms "via" and "connect" are used only for illustrative purposes to differentiate between connections between the metal-1 and metal-2 layers and between the metal-1 and the silicon substrate and/or the polysilicon layer.

Figure 4:
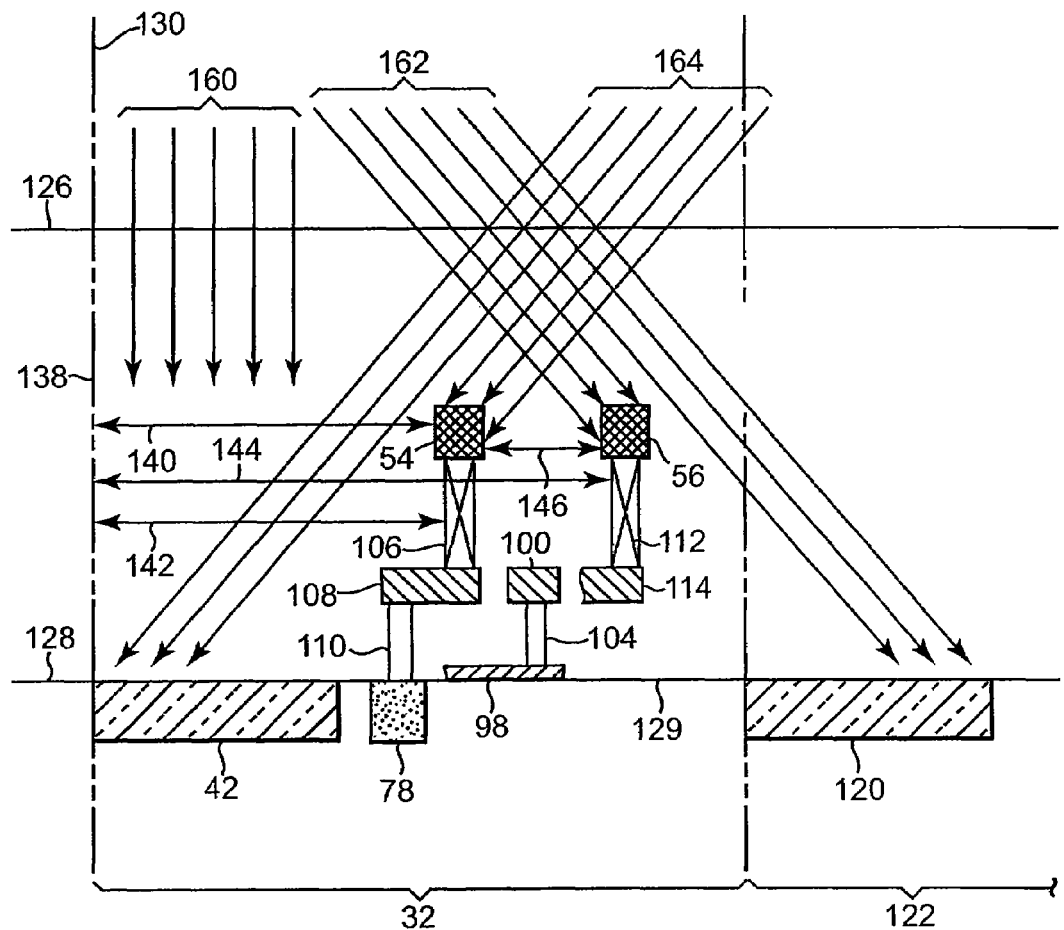
FIG. 4 is a cross-sectional view illustrating portions of the pixel of FIG. 3.

FIG. 4 is a cross-sectional view of pixel 32 as illustrated by FIG. 3. A surface plane of array 30 and a surface plane of the silicon substrate in which PD 42 and the active areas 78 of the transistors positioned are respectively illustrated at 126 and 128. An isolation area 129 separates pixel 32 from the adjacent pixel 122. For ease of illustration, not all components of pixel 32 from FIG. 3 are illustrated, nor are other pixel components such as, for example, micro-lenses, color filters, and various transparent dielectric layers. Again, as with FIG. 3, FIG. 4 is intended for illustrative purposes only.

As described above, pixel 32 of FIG. 3 and FIG. 4 is located in region 60 (see FIG. 1) proximate to an optical center 130 of array 30. Optical axis 130 corresponds to a reference line perpendicular to the surface plane 126 of and intersecting a center of array 30. As illustrated, PVDD line 54, via 106, and via 112 are respectively positioned at distances 140, 142 and 144 from an edge 138 of pixel 32, which is proximate to PD 42. BIT line 56 is positioned at a distance 146 from PVDD line 54.

Generally speaking, pixel 32 of FIG. 4 is configured in a conventional fashion wherein PVDD and BIT lines 54, 56 of metal-2 76, segments 108, 114 of metal-1 74, and vias 106, 112 are positioned over active transistor areas 78 and isolation area 129 so as to keep the area between PD 42 and surface plane 126 free of metal interconnects so that light to PD 42 is not "blocked" by such obstacles. In most conventional imaging arrays, the conventional pixel configuration of pixel 32 as illustrated by FIG. 3 and FIG. 4 is identical for all pixels of the array. In other words, each pixel of array 30 is identically arranged with a fixed pitch. Thus, distances 140, 142, and 144 from edge 138 to PVDD line 54, via 106, via 112, and between PVDD and BIT lines 54, 56 are the same for each pixel of the array.

When pixel 32 is proximate to optical axis 130, such as in region 60, a principal or average ray angle of a bundle of incident light rays 160 incident upon surface plane 126 of array 30 is substantially normal (i.e. perpendicular to) to surface plane 126. As such, the conventional configuration of pixel 34 as illustrated by FIG. 3 and FIG. 4 is effective at allowing incident light rays 160 to reach PD 42.

However, the principal ray angle of a bundle of incident rays incident upon surface plane 126 deviates from normal with the distance from optical axis 130. In general, the deviation of the principal ray angle from normal increases in a non-linear fashion with distance from optical axis 130, with a maximum deviation occurring proximate to the edges of array 30 (i.e. the greatest distance from optical axis 130). The deviation results primarily from what is commonly referred to as the "non-telecentricity" of the lens utilized by an imaging device (not shown) employing imaging array 30. This deviation results in the conventional pixel structure (primarily the metal-2 76 elements) of pixel 32 of FIG. 3 and FIG. 4 causing shadowing (or "geometric shadowing") of the associated photodetector PD 42 or the photodetector of an adjacent pixel, with the shadowing effects worsening as the pixels become more removed from optical axis 130. The shadowing reduces the light intensity received by the pixels, especially those pixels proximate to the edges of imaging array 30, which already see a reduction in light intensity relative to those pixels proximate the optical axis 130 from what is commonly referred to as vignetting (caused by 1/Cosine characteristics of the lens).

For example, if pixel 32 having the conventional configuration of FIG. 4 is positioned at region 62 of array 30 in lieu of region 60 (see FIG. 1), the principal ray angle of incident light upon surface plane 126 would deviate significantly from normal as illustrated by the bundle of incident rays at 162. As a result, when positioned at region 62, BIT line 56 of metal-2 76 blocks incident light to photodetector 120 of adjacent pixel 122, consequently reducing the brightness of an image produced by adjacent pixel 122.

Similarly, if pixel 32 having the conventional configuration of FIG. 4 is positioned at region 64 of array 30, opposite optical axis 130 from region 62 (see FIG. 1), the principle ray angle of incident light upon surface plane would deviate significantly from normal (by a same magnitude but opposite angle from the deviation at region 62) as illustrated by the bundle of incident rays 164. As result, when positioned at region 64, PVDD line 54 of metal-2 76 blocks incident light to PD 42, consequently reducing the brightness of an image produced by pixel 32.

In accordance with the present invention, and as illustrated by FIG. 5 through FIG. 8 below, the metal-2 elements and corresponding vias of pixels 32 (i.e. PVDD and BIT lines 54, 56 and vias 110, 112 in the illustrated examples) are shifted toward optical axis 130 based on their distance from and position to (i.e. to the right or left relative to FIG. 1) optical axis 130. Shifting the metal-2 elements and their corresponding vias toward the optical center of imaging array 30 in accordance with the present invention reduces light shadowing associated with conventional pixel structures.

Metal-1 74 elements (e.g. segment 100) are positioned in closer proximity to surface 128 of the silicon substrate and further away from imaging plane 126 than metal-2 76 elements. As such, metal-1 74 elements generally have little impact on geometric shadowing effects. Geometric shadowing is generally caused by pixel components in layers above metal-1 74 and closer to image plane 126, such as the elements of metal-2 76 as described herein. However, in some pixel architectures, metal-1 74 elements may contribute to geometric shadowing effects. As such, although described herein with respect to metal-2 76 elements and associated interlayer connect elements, the teachings of the present invention (as will be described in greater detail below) can also be applied to metal-1 74 elements and associated interlayer connect elements. The teaching of the present invention can also be applied to elements in metal layers beyond metal-1 and metal-2 when a pixel architecture employs such additional metal layers.

Figure 5:
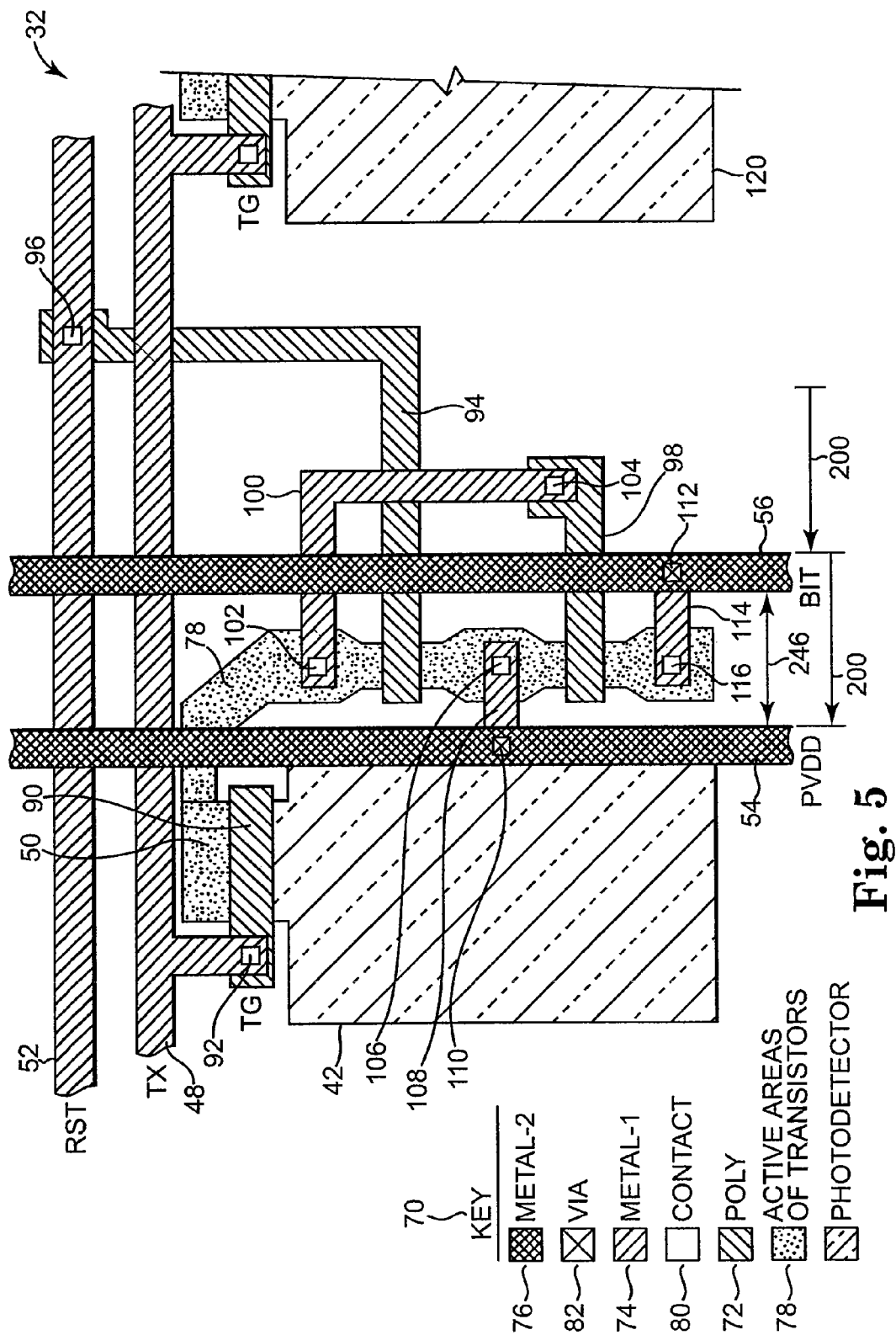
FIG. 5 is an example layout of the pixel of FIG. 2 having shifted metal route positions according to the present invention.
Figure 6:
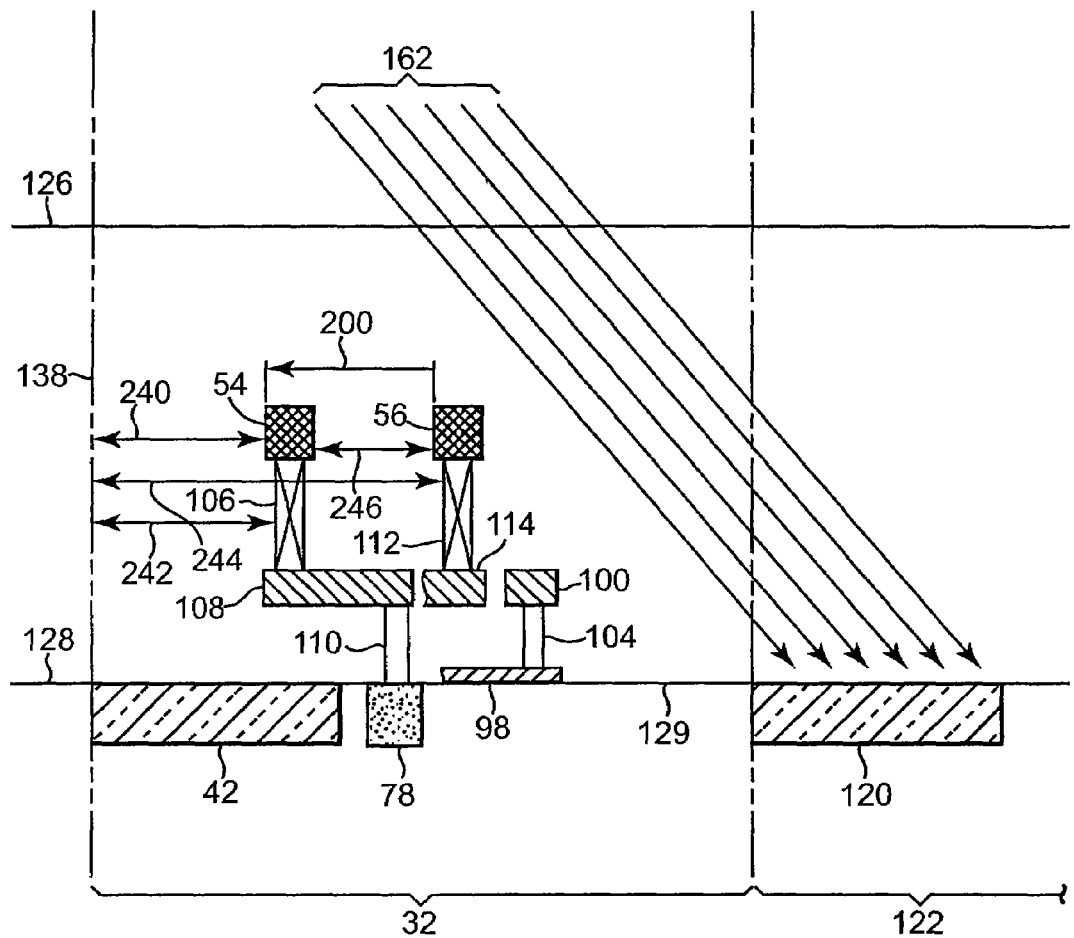
FIG. 6 is a cross-sectional view illustrating portions of the pixel of FIG. 5.

FIGS. 5 and 6 illustrate an example layout of pixel 32 in accordance with the present invention when located in region 62 of imaging array 30. As illustrated, PVDD and BIT lines 54, 56 of metal-2 76 and the corresponding vias 110 and 112 are shifted toward edge 38 by a shift distance 200 relative to their corresponding positions when pixel 32 is located at position 60 (as illustrated by FIGS. 3 and 4). The magnitude of shift distance 200 is based on the distance of pixel 32 from the optical center 130 of imaging array 30. The direction of shift distance 200 depends on the relative position of pixel 32 to optical center 130. Since edge 138 of pixel 32 of FIGS. 5 and 6 faces toward of optical center 130, the direction of shift distance 200 is toward edge 138 (i.e. to the "left" in FIGS. 1, 5, and 6).

With further reference to FIG. 4, distances 240, 242, and 242 between PVDD line 54, and vias 106, 112 respectively to edge 138 are less than distances 140, 142, and 144 by an amount equal to shift distance 200. Since BIT line 56 is also shifted toward edge 138 by shift distance 200, the distance 256 between PVDD and BIT lines 54, 56 is equal to distance 156. As illustrated by FIGS. 5 and 6, the positions and dimensions of metal-1 74 segments 108 and 114 have been adjusted accordingly.

As illustrated by FIG. 6, with PVDD and BIT lines 54, 56 of metal-2 76 and corresponding vias 106, 112 shifted toward edge 138 by shift distance 200, the bundle of incident light rays 162 is no longer blocked and has an unobstructed path to PD 120 of adjacent pixel 122. Additionally, even though PVDD line 54 of metal-2 76 is positioned between PD 42 and surface plane 126, a bundle of light rays (not illustrated) incident upon pixel 32 has a principal ray angle similar to that of the bundle of lights rays 162 and, thus, will not be blocked by PVDD line 54.

Figure 7:
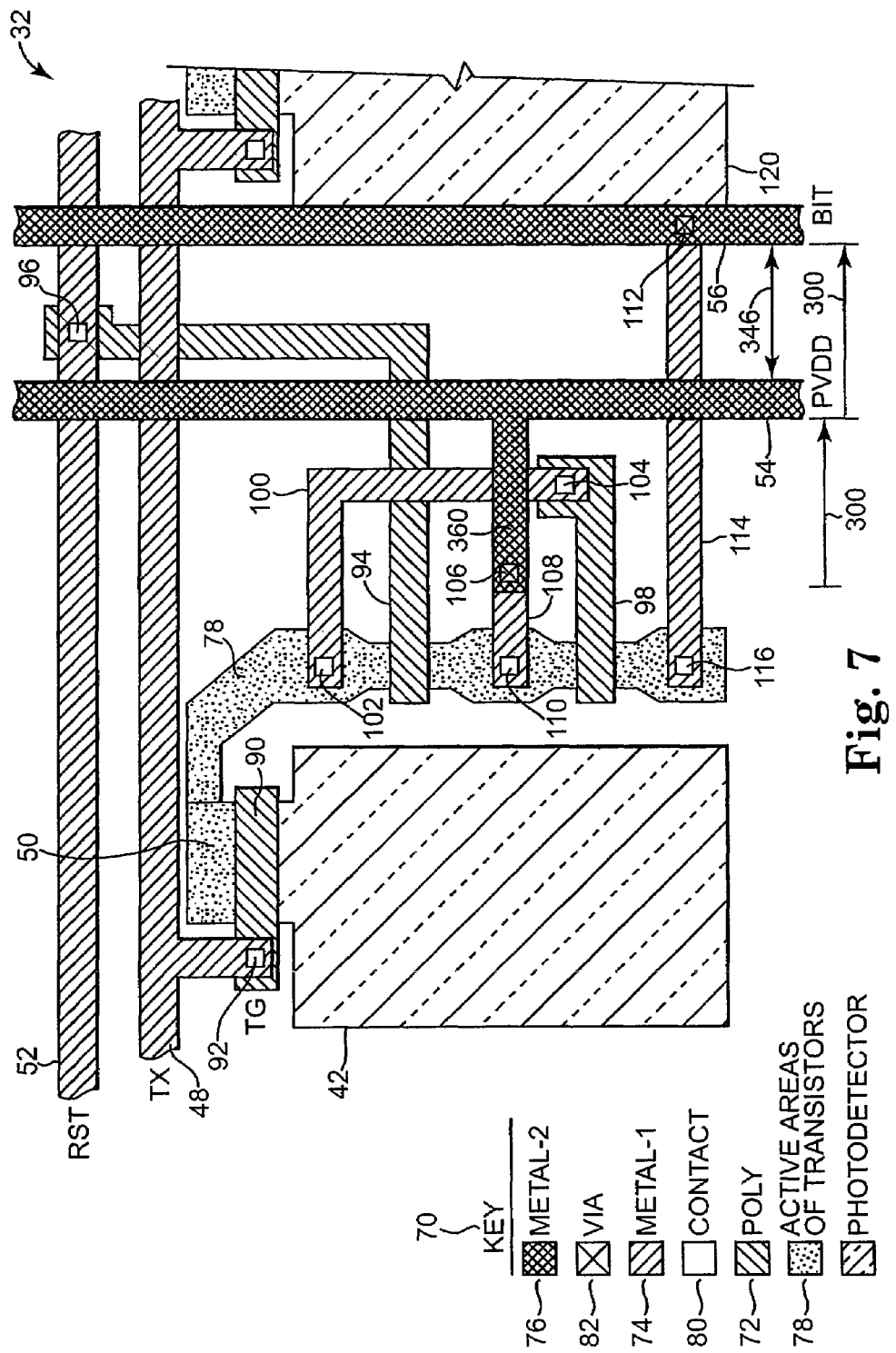
FIG. 7 is an example layout of the pixel of FIG. 2 having shifted metal route positions according to the present invention.

FIGS. 6 and 7 illustrate an example layout of pixel 32 in accordance with the present invention when located at region 64 of imaging array 30. As illustrated, PVDD and BIT lines 54 and 56 of metal-2 76 are shifted away from edge 138 by a shift distance 300 relative to their corresponding positions when pixel 32 is located at region 60 (as illustrated by FIGS. 3 and 4). As when pixel 32 is located at region 62 (as illustrated by FIGS. 5 and 6), the magnitude and direction of shift distance 300 are based respectively on the distance pixel 32 is from and the relative position of pixel 32 to optical center 130 of imaging array 30. Since edge 138 of pixel 32 of FIGS. 7 and 8 faces away from optical center 130, the direction of shift distance 300 is away from edge 138 (i.e. to the "right" in FIGS. 1, 7, and 8). In the illustrated example, region 64 is at substantially an equal distance from optical center 130 of array 30 ad region 62.

However, unlike when pixel 32 is located at region 62 (as illustrated by FIGS. 5 and 6), only via 112 associated with BIT line 56 is shifted toward optical center 130 (i.e. to the right) by shift distance 300. Because the pixels are so densely packed within the silicon substrate, the locations of the photodetectors and active transistor areas (e.g. PD 42 and active areas 78), the transistors (e.g. reset transistor 44 and source-follower transistor 46) and associated contacts (e.g. contacts 102, 104, 110, and 116) are at substantially fixed positions. As such, metal-1 72 segment 100 coupling the source of reset transistor 44 to the gate of source-follower transistor 46 is at a substantially fixed location.

Since via 106 couples PVDD line 54 to the drains of reset and source-follower transistors 44, 46 by metal-1 72 segment 108, via 106 cannot be shifted along with PVDD line 54 by shift distance 300 because such a shift would require metal-1 72 segment 108 to be extended across metal-1 72 segment 100. As such, via 106 is at a substantially fixed position. Therefore, in order to maintain electrical connection between the shifted PVDD 54 and the drains of reset and source-follower transistors 44, 46, a metal-2 76 span element 360 is added to pixel 32 to couple PVDD 54 to via 112.

In one embodiment, span element 360 is contiguous with and extends from PVDD 54 to via 106 by a distance at least equal to shift distance 300. In one embodiment, span element 360 is contiguous with and extends from PVDD 54 to via 106 by a distance substantially equal to shift distance 300. Although illustrated as extending from PVDD 54 in a linear fashion, in other embodiments, span element may include bends and angles to avoid conflicts with other pixel elements (not illustrated) which may be positioned between PVDD 54 and via 106.

Figure 8:
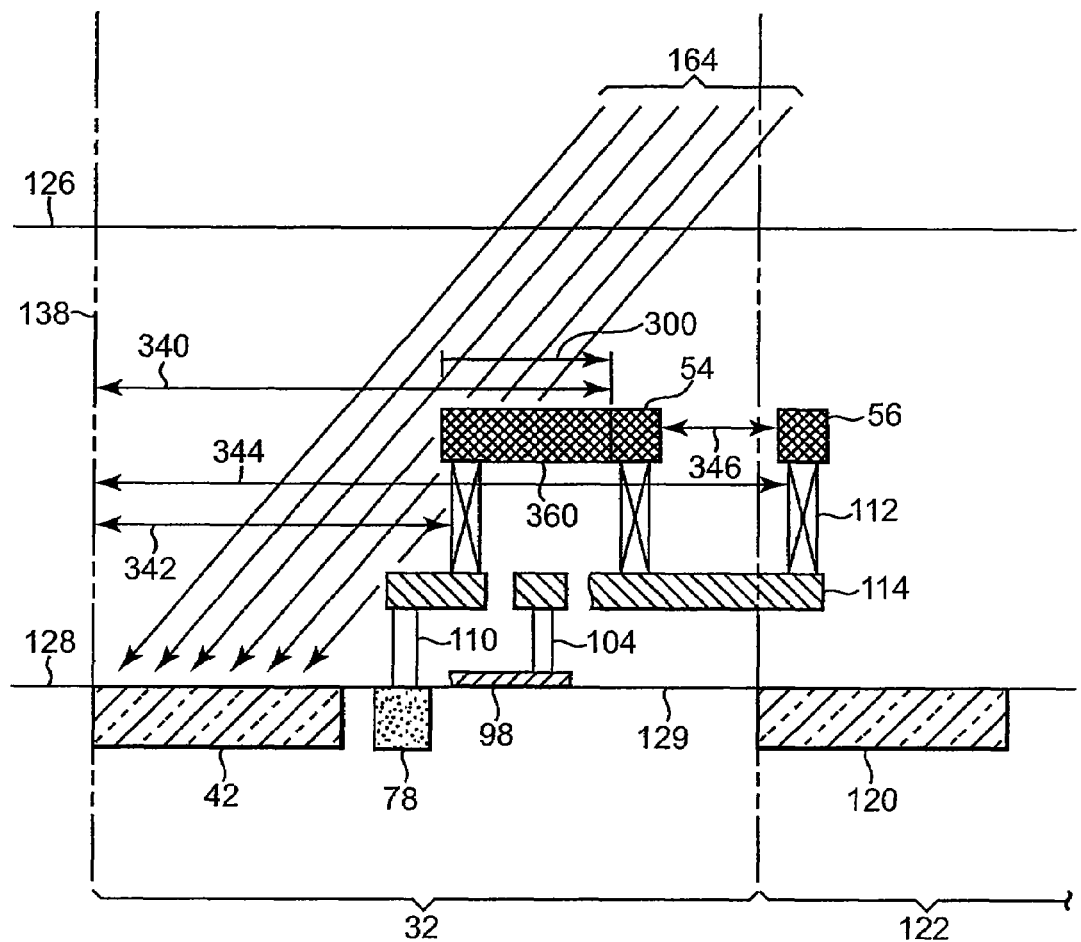
FIG. 8 is a cross-sectional view illustrating portions of the pixel of FIG. 7.

With further reference to FIG. 4, distances 340 and 344 between PVDD line and 54 and via 112 respectively to edge 138 are greater than distances 140 and 144 by an amount equal to shift distance 300. Since BIT line 56 is also shifted away from edge 138 by shift distance 300, the distance 356 between PVDD and BIT lines 54, 56 is equal to distance 156. As illustrated by FIGS. 7 and 8, metal-1 72 segment 114 has been extended by shift distance 300.

As illustrated by FIG. 8, with PVDD and BIT lines 54, 56 of metal-2 76 shifted away from edge 138 by shift distance 300, the bundle of incident light rays 164 is no longer blocked and has an unobstructed path to PD 42. Additionally, even though BIT line 56 of metal-2 76 is positioned between surface plane 126 and PD 120 of adjacent pixel 122, a bundle of light rays (not illustrated) incident upon pixel 32 has a principal ray angle similar to that of the bundle of light rays 164 and, thus, will not be blocked by BIT line 56.

As described above, the principal ray angle of light incident upon imaging array 30 varies non-linearly with distance from optical axis 130 across imaging array 30, with the greatest deviations occurring along the edges of imaging array 30. As such, the magnitude in the shift distance of metal-2 76 elements for each pixel 32 of array 30 is dependent on the distance of the pixel from optical axis 130. The magnitude of the shift distance is also dependent on the distance of metal-2 76 from surface plane 126. Thus, in general, the shift distances are greater in magnitude for pixels 32 situated further away from optical axis 130 than for pixels situated closer to optical axis 130. Also, due to the non-linear nature of the deviations from normal of the principal ray angle across array 30, the magnitudes of shift distances also increases non-linearly as the pixels become further removed from optical axis 130.

Figure 9:
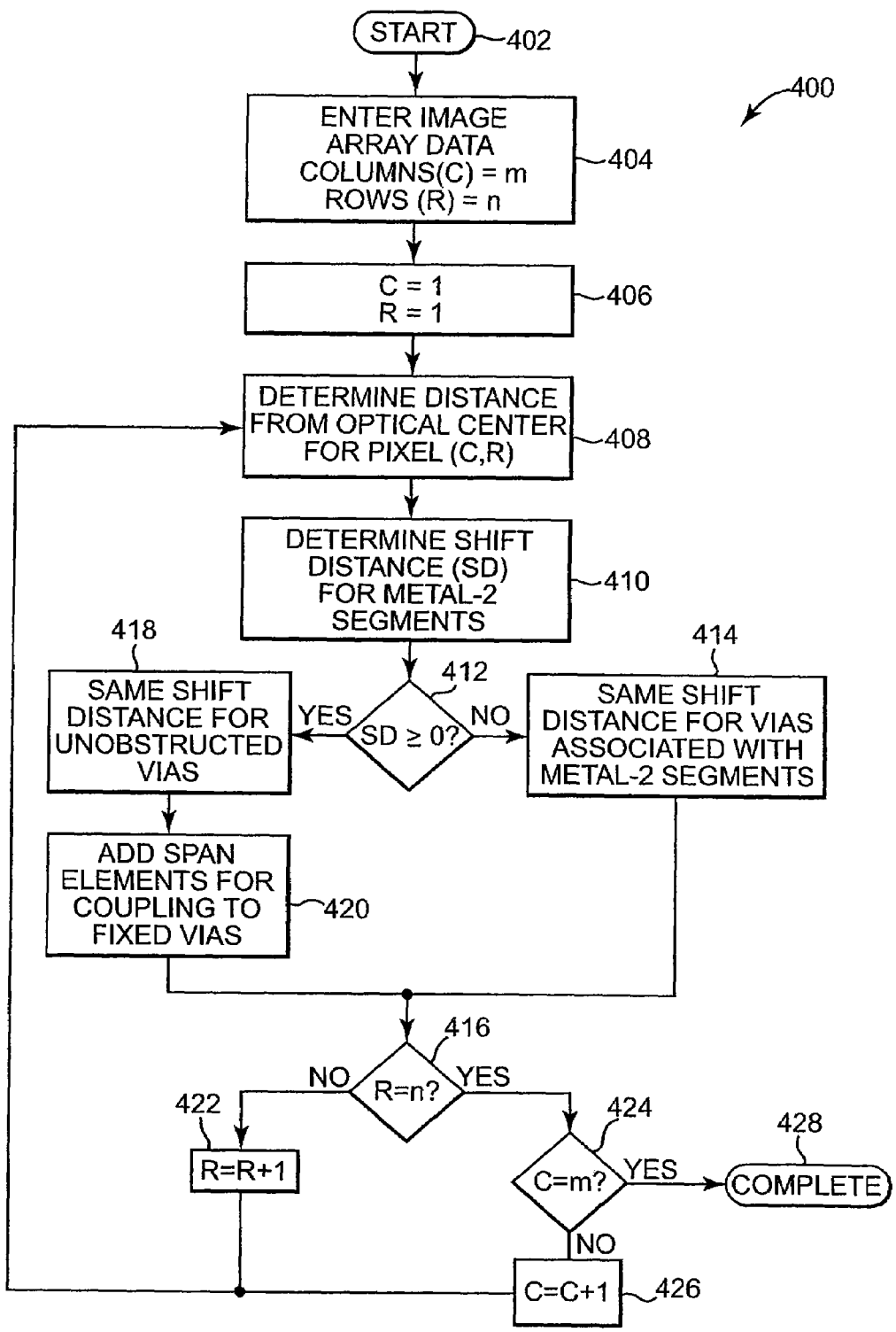
FIG. 9 is a flow diagram illustrating generally one embodiment of a process for shifting metal route positions according to the present invention.

FIG. 9 is a flow diagram illustrating one example embodiment of a process 400 for determining shift distances for each pixel of an array of pixels to be fabricated, such as pixels 32 of array 30. Process 400 begins at 402. At 404, parameters/data associated with the imaging array to be fabricated are determined and include information such as the number "m" of columns (C) and the number "n" of rows (R) of the imaging array, a "conventional" or base configuration of a pixel of the array (e.g. pixel 32 of FIG. 3 and FIG. 4, and including dimensions describing the pixel structure), and data related to a lens configuration to be utilized with the array (including non-linear characteristics of the principal ray angles associated with the lens).

At 406, the values for column counter (C) and row counter (R) are each set to a value of "1". At 408, based on the dimensions of the array entered at 404, an optical center of the array is determined. Based on the value of C and R, the distance of the present pixel (R, C) from the optical center is determined.

At 410, based on the distance from optical center as determined at 408 and the non-linear characteristics of the principal ray angle and dimensions of the base pixel structure from 404, a shift distance (SD) is determined for the metal-2 elements of the present pixel (R, C)

At 410, process 400 queries whether the SD is greater than or equal to zero. If the answer to the query is "no", process 400 proceeds to 414. At 414 (with additional reference to FIGS. 1, 5, and 6), since SD is less than zero, the present pixel (R, C) is located to the "right" of the optical center and the metal-2 segments are being shifted to the "left". As such, there are no fixed transistors or connecting elements (e.g. segment 100 of FIG. 3) preventing movement of vias associated with metal-2 segments, and the vias will be shifted by the same SD as the corresponding metal-2 segments. Process 400 then proceeds to 416.

If the answer to the query at 412 is "yes", process 400 proceeds to 418. At 418 (with additional reference to FIGS. 1, 5, and 6), since SD is greater than zero, the present pixel (R, C) is located to the "left" of the optical center and the metal-2 segments are being shifted to the "right". As such, there are fixed transistors and/or connecting elements (e.g. segment 100 of FIG. 7) which prevent movement of vias associated with metal-2 segments. As such, vias of present pixel (R, C) which are not obstructed will be shifted by the same SD as the corresponding metal-2 segments, and vias whose movement is obstructed will remain at their "base" position.

Process 400 then proceeds to 420, where span elements are added to the pixel structure of the present pixel (R, C) to couple the fixed vias to their corresponding shifted metal-2 segments. In one embodiment, a length of the span elements is substantially equal to SD of the present pixel (R, C). Process 400 then proceeds to 416.

At 416, process 400 queries whether row counter "R" is equal to the number "n" of rows in the array to be fabricated. If the answer to the query is "no", shift distances have not been determined for all pixels of the current row "R", and process 400 proceeds to 422. At 422, row counter "R" is incremented by a value of "1" and process 400 returns to 408 where the above described process is repeated for the next pixel of the present column "C."

If the answer to the query at 416 is "yes", shift distances have been determined for all pixels of the current column "C", and process 400 proceeds to 424. At 424, process 400 queries whether column counter "C" is equal to the number "m" of columns in the array to be fabricated. If the answer to the query is "no", shift distances have not been determined for all columns of pixels of the array to be fabricated, and process 400 proceeds to 426. At 426, column counter "C" is incremented by a value of "1" and process 400 returns to 408 to determine shift distances for all pixels of the next column of pixels. If the answer to the query at 424 is "yes", shift distances have been determined for all pixels of the array to be fabricated and process 400 is complete, as indicated at 428.

The above described process can be performed using a computer program on a computer system. For example, the characteristics of a bundle of light rays (e.g. the principal ray angle) incident upon each pixel 32 of array 30 can be determined by modeling the associated lens system. The placement of metal-2 segments, the corresponding vias, and required span elements can then be determined algorithmically based on the characteristics of the corresponding bundle of light rays so as to optimize a pixel operating parameter (e.g. photo radiation incident upon the photodetector). While original software may be developed, one example of a commercially available product that can be employed to perform the above described process is SKILL SCRIPT® in CADENCE IC Design Tools®.

By shifting the metal interconnect segments and corresponding vias as described above, shadowing of the photodetectors of the array of pixels is reduced, thereby increasing the brightness of images acquired by the image sensor. Additionally, by determining and providing span elements in accordance with the present invention, metal interconnect segments associated with fixed circuit elements, such as vias, are shifted while maintaining in required electrical communication with pixel elements.

While shifting the metal interconnect segments in this fashion reduces shadowing, shifting the metal interconnect segments toward the optical center of the array while maintaining required operational spacing between pixel elements becomes increasingly difficult as pixel dimensions continue to decrease. Additionally, for ease of fabrication and for ease of connection of the array to peripheral circuitry, these metal interconnect lines or metal interconnect segments of conventional array are typically on a fixed spacing (i.e. have a fixed pitch) and extend linearly across the array. For example, with reference to FIGS. 1, 2 and 3A, TX and RST lines 48 and 52 extend across each row of pixels and PVDD and BIT lines 54 and 56 extend across each column of pixels of imaging array 30. By individually shifting the interconnect segments of each pixel toward on optical center of the array, the metal interconnect segments no longer extend linearly across the array and are no longer on a fixed pitch, thereby making the array more difficult to fabricate and connect with peripheral circuitry.

In light of the above, in one embodiment of an image sensor according to the present invention, the metal interconnect segments in one or more of the metal layers are positioned on a first pitch while the photodiode, associated transistors, and interconnect segments on a second pitch which is greater than the first pitch. As will be described in greater detail below, by employing a second pitch which is incrementally greater than the first pitch, the photodiodes and associated circuitry of each pixel are incrementally positioned further away from an optical center of the array than the associated metal interconnect segments on the first pitch. As a result, the photodiodes and associated circuitry of a pixel are positioned increasingly further from the associated metal interconnect segments on the first pitch with distance from the optical center of the array, thereby reducing shadowing of the pixels' photodiodes while maintaining the metal interconnect segments on a fixed pitch so as to maintain ease of connection to peripheral circuitry.

Figure 10:
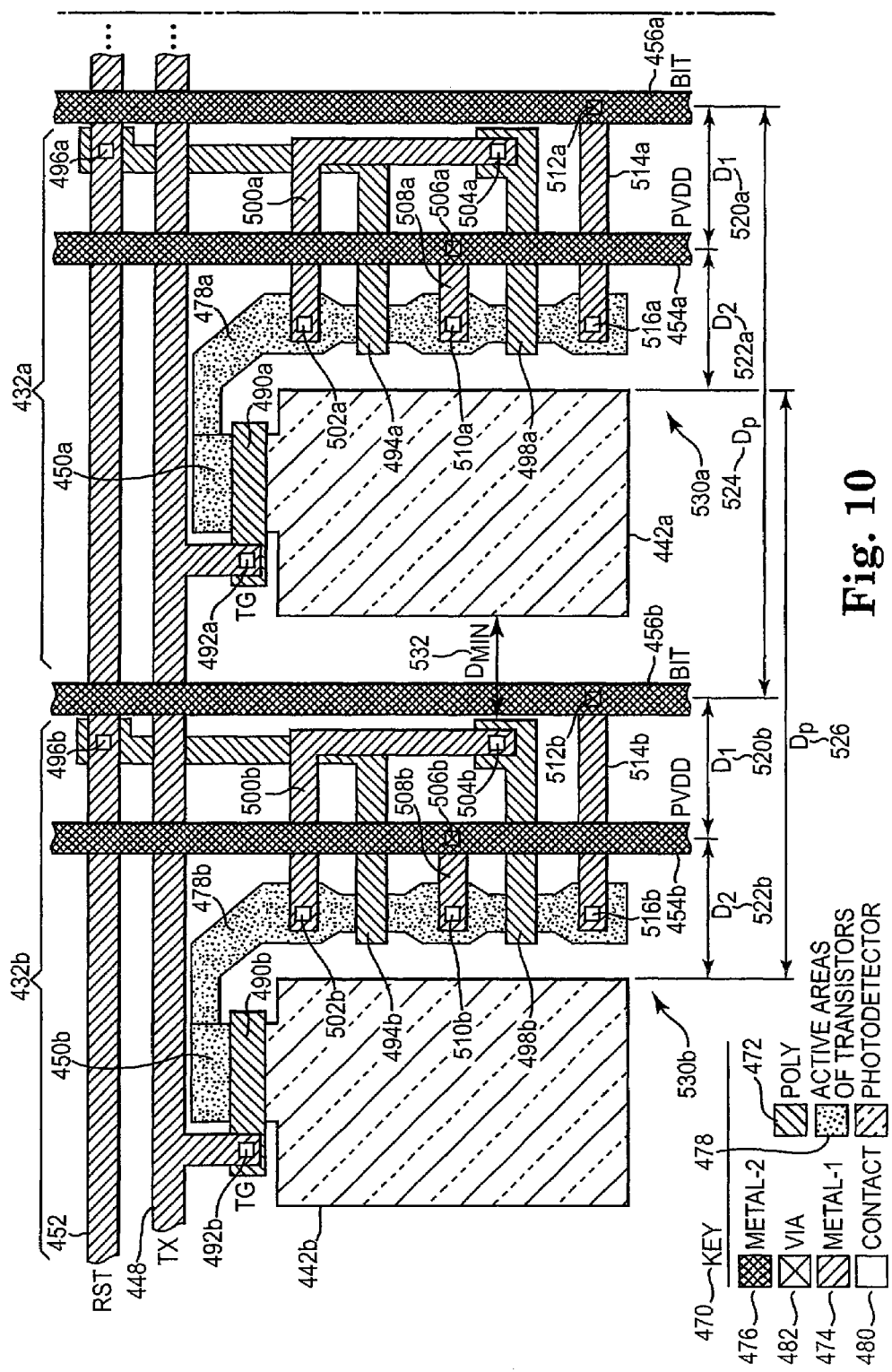
FIG. 10 illustrates pixels according to one example of a conventional pixel configuration.

FIG. 10 illustrates generally an example layout of a pair of consecutive pixels, such as pixels 432a and 432b of a row 434 of pixels that extends in a generally perpendicular fashion from an optical axis 436, which along with optical axis 438 extend tangentially from an optical center 439 of imaging array 30 (see FIG. 1). As illustrated, pixels 432a and 432b each comprise components and structures similar to those illustrated by pixel 32 of FIGS. 2 and 3.

The elements of pixels 432a and 432b are disposed in various layers which overlay a silicon substrate which forms a "floor" of imaging array 30. With reference to drawing key 470, imaging array 30 includes a poly-silicon layer ("poly") 472 overlaying the silicon substrate, a first metal layer ("metal-1") 474 positioned above poly 472, and a second metal layer ("metal-2") 476 positioned above metal-1 474. Dielectric insulation layers (not illustrated) are positioned between poly 472 and metal-1 474, and between metal-1 474 and metal-2 476. Imaging array 30 and pixels 432a, 432b may include additional layers, but for ease of illustration, are not described or discussed herein.

Photodiodes (PD) 442a, 442b, floating diffusions (FD) 450a, 450b, and active areas 478a, 478b of transistors (i.e. transfer gates, reset transistors, and source-follower transistors, see FIG. 2) of pixels 432a and 432b are disposed in active regions (i.e. doped regions) of the silicon substrate. Contacts 480 provide conductive pathways to couple metal-1 474 to active areas 478 and to poly 472. Vias 482 provide conductive pathways to couple metal-2 476 to metal-1 474.

Transfer (TX) and reset (RST) lines 448 and 452 are disposed in metal-1 474 and extend across pixels 432a and 432b and all other pixels of row 434. Voltage (PVDD) and bit (BIT) lines 454a, 454b and 456a, 456b are disposed in metal-2 476 and respectively extend across pixels 432a, 432b and all other pixels of the associated column of pixels. Segments 490a, 490b of poly-472 are respectively positioned over PD 440a, 440b and FD 450a, 450b to form the transfer gates of pixels 432a, 432b. TX line 448 is respectively coupled to segments 490a and 490b of poly 472 by contacts 492a and 492b.

Segments 494a and 494b of poly 472 are respectively positioned over corresponding active areas 478a and 478b to form the gates of the reset transistors of pixels 432a, 432b and extend and are coupled to RST line 452 by contacts 496a and 496b. Segments 498a and 498b of poly 472 are respectively positioned over active areas 478a and 478b to form the gates of the source-follower transistors of pixels 432a, 432b.

Transfer (TX) and reset (RST) lines 448 and 452 are disposed in metal-1 474 and extend across pixels 432a and 432b and all other pixels of row 434. Voltage (PVDD) and bit (BIT) lines 454a, 454b and 456a, 456b are disposed in metal-2 476 and respectively extend across pixels 432a, 432b and all other pixels of the associated column of pixels. Segments 490a, 490b of poly-472 are respectively positioned over PD 442a, 442b and FD 450a, 450b to form the transfer gates of pixels 432a, 432b. TX line 448 is respectively coupled to segments 490a and 490b of poly 472 by contacts 492a and 492b.

PVDD lines 454a and 454b are respectively coupled by vias 506a and 506b to first ends of segments 508a and 508b of metal-1 474 which, in-turn, are respectively coupled at second ends to the drains of reset and source-follower transistors of active area 478a, 478b by contacts 510a and 510b. BIT lines 456a and 456b are respectively coupled by vias 512a and 512b to first ends of segments 514a and 514b of metal-1 474 which, in-turn, are respectively coupled at second ends to the sources of the corresponding source-follower transistors by contacts 516a and 516b.

It is noted that FIG. 10 and FIG. 11, as will be described below, are intended for illustrative purposes and are not drawn to scale. As such, element sizes, spacing between elements, and positions of elements with respect to one another are exaggerated and adjusted for ease of illustration and are not intended to represent actual pixel structures and dimensions. It is also noted that vias (e.g. vias 506 and 512) and contacts (e.g. 492, 496, 502, 504, etc.) can be described generally as "interlayer connect elements." As the name suggests, such interlayer connect elements serve as "conduits" to electrically couple non-contacting layers (e.g. poly-472 and metal-1 474) to one another. The terms "via" and "contact" are used for descriptive purposes to differentiate connections between metal-1 474 and metal-2 476 from connections between metal-1 474 and poly 472 and the silicon substrate.

Figure 11:
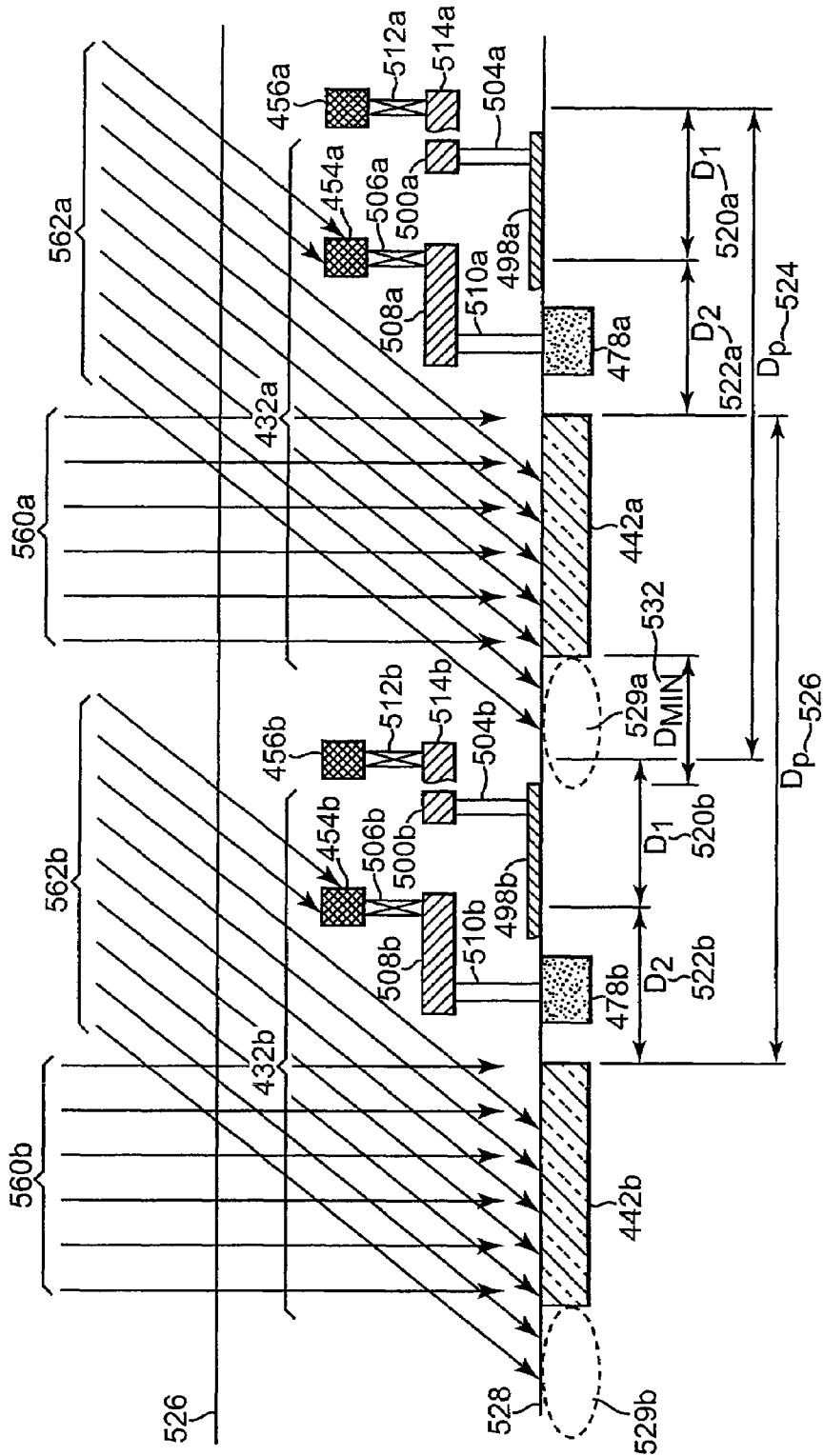
FIG. 11 is a cross-sectional view illustrating portions of the pixels of FIG. 10.

FIG. 11 illustrates generally a cross-sectional view of pixels 432a and 432b of FIG. 10. As with FIG. 10 above, FIG. 11 is intended for illustrative purposes and not drawn to any particular scale or dimension. For ease of illustration, only portions of pixels 432, 432b of FIG. 10 are shown, and not all components of pixels 432a, 432b and imaging array 30 are shown (e.g. micro-lenses, color filters, and various transparent dielectric layers). As described above, pixels 432a and 432b comprise a consecutive pair of pixels of a row of pixels 434 beginning at optical axis 436 and extending generally in a perpendicular fashion across imaging array 30 (see FIG. 1). With respect to FIG. 1 and FIGS. 10 and 11, pixels 432a and 432b extend substantially horizontally to the left from optical y-axis 436.

A surface plane and the semiconductor substrate of array 30 are respectively illustrated at 526 and 528. PDs 442a, 442b and transistor active areas 450a, 450b are illustrated as being disposed and positioned within substrate 528. An isolation area 529a separates PD 442a of pixel 432a from adjacent elements of pixel 432b and an isolation area 529b separates PD 442b of pixel 432b from a next pixel (not shown) of row 434.

The layout of pixels 432a, 432a of FIGS. 10 and 11 illustrate generally one example of a conventional pixel configuration, wherein elements of the pixels' structures are positioned as much as possible outside the vertical space between PDs 442a, 442b and surface plane 526 so that light incident upon surface plane 526 is not blocked from reaching PDs 442a, 442b. As such, PVDD and BIT lines 454a and 456a of metal-2 476, segments 494a and 496a of metal-1 474, segments 500a, 508a, and 514a of poly 472, contacts 496a and 504a, and vias 506a and 512a are positioned over active and isolation areas 478a and 520a of pixel 432a. Similarly, PVDD and BIT lines 454b and 456b of metal-2 476, segments 494b and 496b of metal-1 474, segments 500b, 508b, and 514b of poly 472, contacts 496b and 504b, and vias 506b and 512b are positioned over active and isolation areas 478b and 520b of pixel 432b.

FIGS. 10 and 11 also illustrate array 30 in accordance with a conventional array structures, wherein all pixels of the array, such as pixels 432a and 432b, have a substantially identical configuration (see also FIG. 14A below). As such, spacing between like elements of any given pixel of the array is substantially the same for all pixels of the array. For example, as illustrated in FIGS. 10 and 11, spacings 520a and 522a between PVDD and BIT lines 454a, 456a and between PVDD line 454a and PD 442a of pixel 432a are equal respectively to spacings 520b and 522b between PVDD and BIT lines 454b, 456b and between PVDD line 454b and PD 442b. As illustrated in FIGS. 10 and 11, spacings 520a and 520b and spacings 522a and 522b of pixels 432a and 432b are indicated respectively as being equal to distances D1 and D2.

Also according to conventional array structures, all pixels of array 30 are at substantially a same desired spacing or desired pitch from on another across the array. Examples of standard pitches employed by conventional image sensor arrays are 7.4 μm (microns), 5.49 μm, and 3.3 μm. As such, an inter-pixel spacing or pitch between like elements of adjacent pixels is substantially equal to the desired pitch of the array. For example, as illustrated in FIGS. 10 and 11, a pitch 524 between BIT lines 456a and 456b and a pitch 526 between PDs 442a and 422b of pixels 432a and 432b are each substantially equal to a desired pitch, $D_P$, of array 30. Additionally, isolation areas between the photodiode and elements of adjacent pixels are maintained at least at a minimum spacing, $D_{MIN}$. For example, isolation area 529a between PD 442a and elements of pixel 432b is indicated as having a spacing 532 equal to $D_{MIN}$.

As used herein, the term "sense element" refers collectively to the photodiode and associated transistors and intra-connect elements of a given pixel, with the term "intra-connect elements" referring to metal and poly elements that are employed locally within a given pixel to couple the photodiode and associated transistors to one another and to metal interconnect segments or lines that extend across the array and interconnect all pixels of a given row or column. For example, in one embodiment, the intra-connect segments of pixel 432a of FIGS. 10 and 11 include segments 490a, 494a and 498a of poly 372, segments 500a, 508a and 514a of metal-1 374, contacts 492a, 502a, 504a, 510a and 516a, and via 506a, which couple PD 442a and the transistors of active area 478a to one another and to interconnect lines TX 448, RST 452, PVDD 454a, and BIT 456a.

As such, in one embodiment, sense element 530a of pixel 432a comprises PD 442a, transistors of active areas 478a, and intra-connect elements as described above. Similarly, sense element 530b of pixel 432b comprises PD 442b, associated transistors of active area 478b, and those intra-connect elements which couple PD 442b and the associated transistors of active area 478b to one another and to interconnect lines TX 448, RST 452, PVDD 454b, and BIT 456b As such, according to the example conventional pixel and array configuration illustrated by FIGS. 10 and 11, a pitch 524 between BIT lines 456a and 456b is substantially equal to pitch 526 between sense element 530a and 530b of pixels 432a and 432b, with each being substantially equal to desired pitch, $D_P$, of array 30.

For reasons similar to those described above with respect to FIGS. 3 and 4, pixels 432a, 432b of FIGS. 10 and 11 are effective at allowing incident light rays to reach PDs 442a, 442b when positioned proximate to optical center 439 (see FIG. 1) where the principle or average ray angles of bundles of incident light rays, such as bundles of light rays 560a, 560b, are substantially normal to surface plane 526. However, when pixels 432a, 432b are positioned away from optical center 439 (as illustrated by FIG. 1), the principle ray angles of bundles of incident lights rays upon surface plane 526, such as bundles of incident light rays 562a, 562b, deviates from normal. The amount deviation depends upon several factors, such as the distance of the pixel from the array's optical center and the optical system associated with the array, with the maximum deviation generally occurring at the edges of the array. As illustrated by bundles of incident light rays 562a, 562b, this deviation results in elements of the pixels' structures, such as PVDD lines 454a, 454b, blocking incident light and "shadowing" portions of PDs 442a, 442b.

Figure 12:
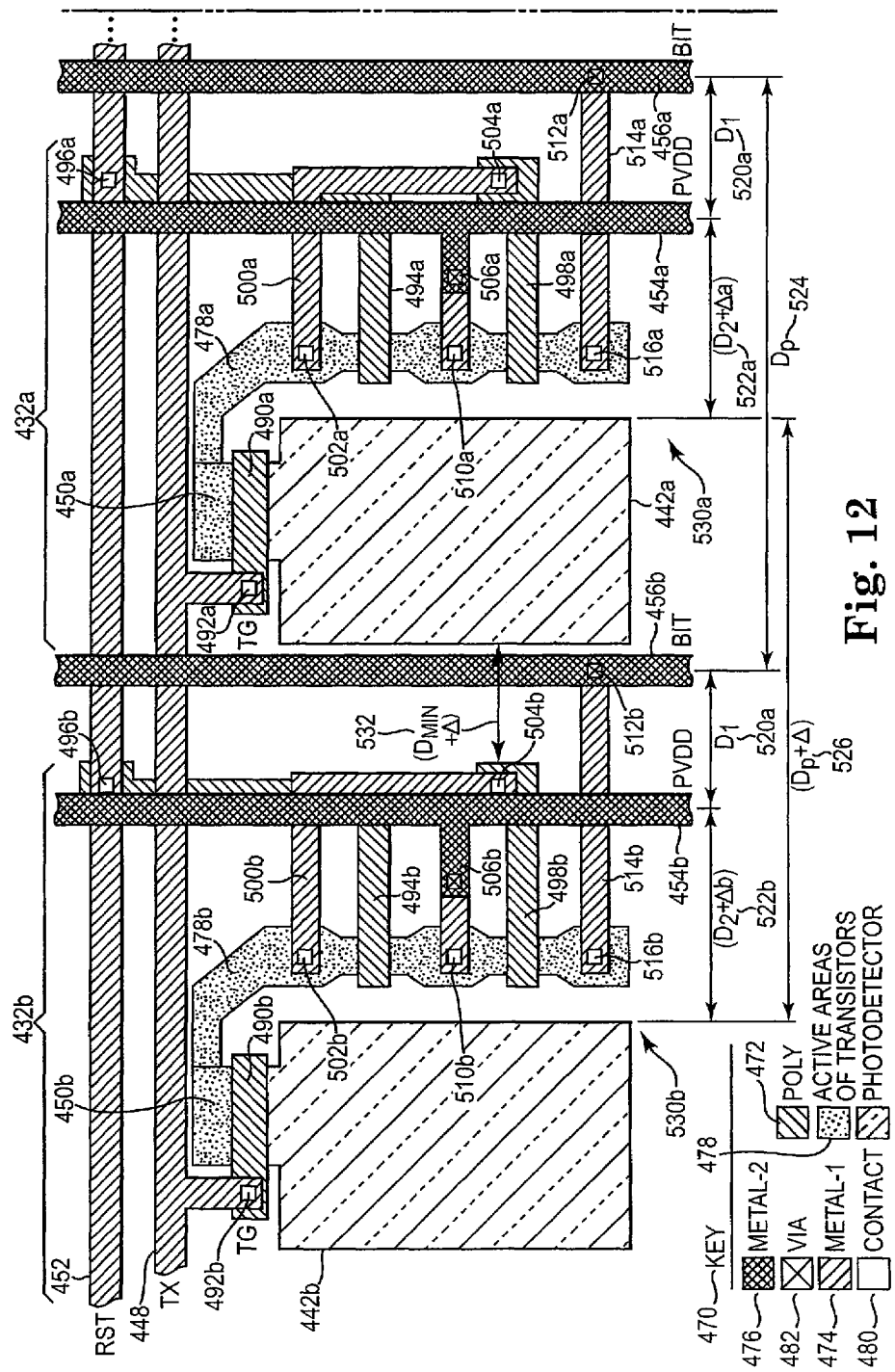
FIG. 12 illustrates one embodiment of the pixels of FIG. 10 configured according to the present invention.
Figure 13:
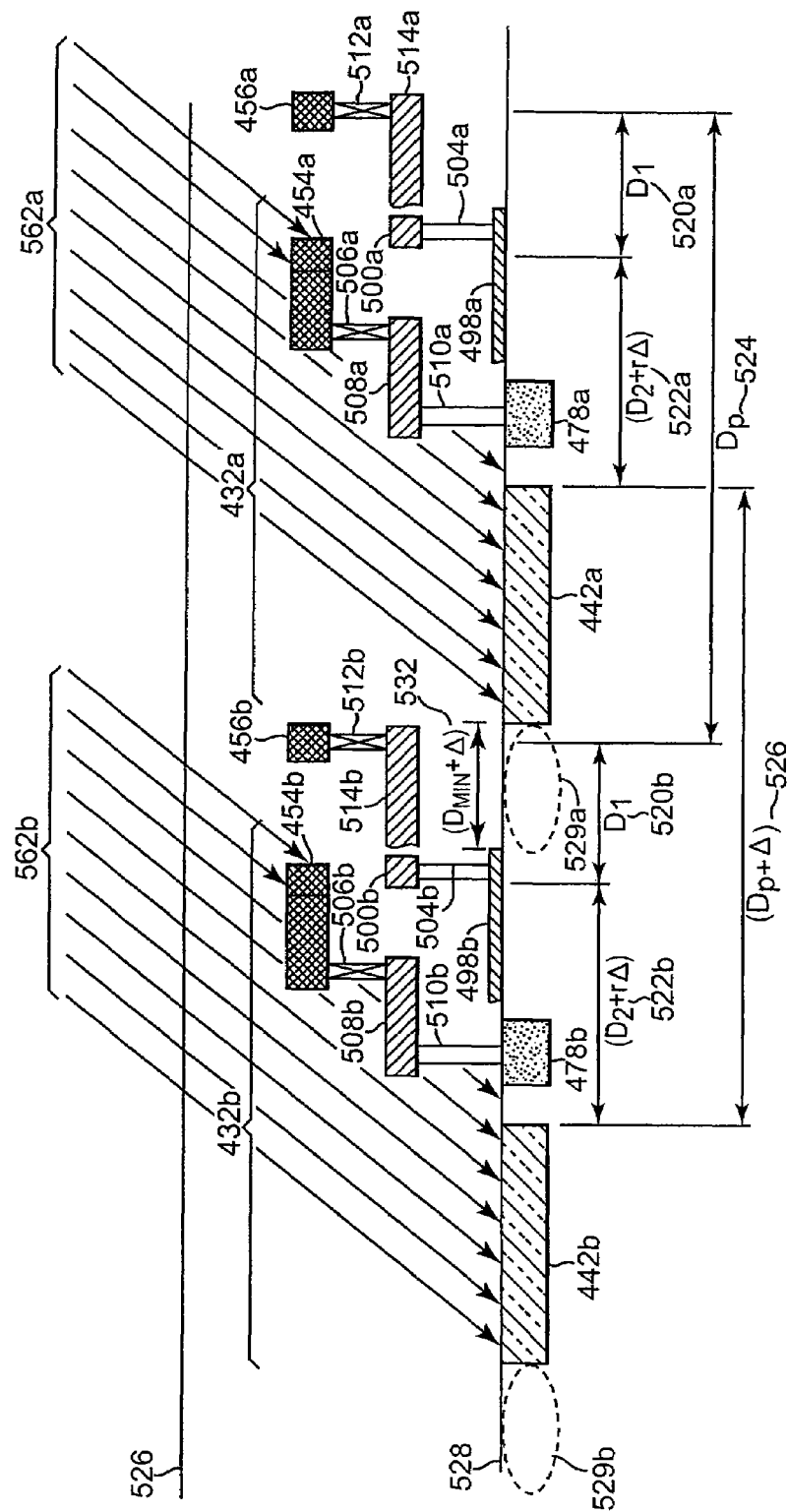
FIG. 13 is a cross-sectional view illustrating portions of the pixels of FIG. 12.

In light of the above, FIGS. 12 and 13 illustrate one embodiment of pixels 432a and 432b of imaging array 30 according to the present invention, wherein the pitch 526 between sense elements 530a and 530b is an incremental amount (Δ) greater than the pitch 524 between PVDD lines 454a and 454b of metal-2 476. Relative to the conventional configurations illustrated by FIGS. 10 and 11, the pitch between metal-2 476 lines remains unchanged such that pitch 524 between PVDD lines 454a and 454b remains at pitch $D_P$, and the spacings between PVDD and BIT lines 454a and 456b and between PVDD and BIT lines 454b and 456b remain at distance D1.

However, pitch 526 between sense elements 530a and 530b of pixels 432a and 432b is equal to pitch $D_P$ plus the incremental amount Δ. As a result, the spacing 522a between PVDD 454a and PD 442a of pixel 432a and the spacing 522b between PVDD 454b and PD 442b of pixel 432b are increased relative to that a conventional pixel and array structures as illustrated by FIGS. 10 and 11. As illustrated, the spacing 522a between PVDD 454a and PD 442a of pixel 432a is equal to distance D1 plus an incremental amount, Δa, and the spacing 522b between PVDD 454b and PD 442b of pixel 432b is equal to distance D1 plus an incremental amount, Δb.

In one embodiment, wherein the pitch between the sense elements is greater by the incremental amount Δ than the pitch between the metal-2 interconnect segments across the entire array (as further illustrated by FIG. 14B below), the incremental amount Δb will be greater than the incremental amount Δa by the incremental increase in pitch, Δ, and with the incremental amounts Δa and Δb increasing with distance from optical axis 436. In one embodiment (as further illustrated by FIG. 14C below), the incremental amount Δb may be equal to the incremental amount Δa.

As illustrated by FIG. 13, by incrementally increasing the spacings 522a and 522b respectively between PVDD 454a and PD 442a and between PVDD 454b and PD 442b, shadowing of PDs 442a and 442b by PVDDs 454a and 454b is reduced, thereby increasing the amount of charge accumulated by the pixels during an integration period and increasing the brightness of images produced by imaging array 30. Additionally, by incrementally positioning photodiodes of each pixel further from the associated metal interconnect segments with increasing distance from the optical center, the photodiodes receive incident light that may otherwise been undesirably incident upon an adjacent pixel, thereby resulting in a potential reduction of pixel cross-talk.

Due to the incremental increase Δ in the pitch 526 between sense elements 530a and 530b, the spacing 532 between PD 442a and elements of pixel 432b (e.g. segment 498b of poly 472) is also increased by the incremental amount Δ such that spacing 532 is equal to the sum of $D_{MIN}$ and the incremental amount Δ. Additionally, it is noted that span elements 534a and 534b are extended respectively from PVDD lines 454a and 454b to shift vias 506a and 506b so as to maintain required spacing from segments 500a and 500b of metal-1 474.

In one embodiment (not illustrated), because the isolation spacing 532 is greater than $D_{MIN}$ by the incremental amount Δ, PD 442a is increased in dimension by the incremental amount Δ, thereby enabling PD 442a to receive additional incident light. For example, with further reference to FIG. 14B below, each pixel of a row of pixels can be increased in dimension when a pitch between sense elements is greater than a pitch between metal interconnect segments across the array.

Figure 14A:
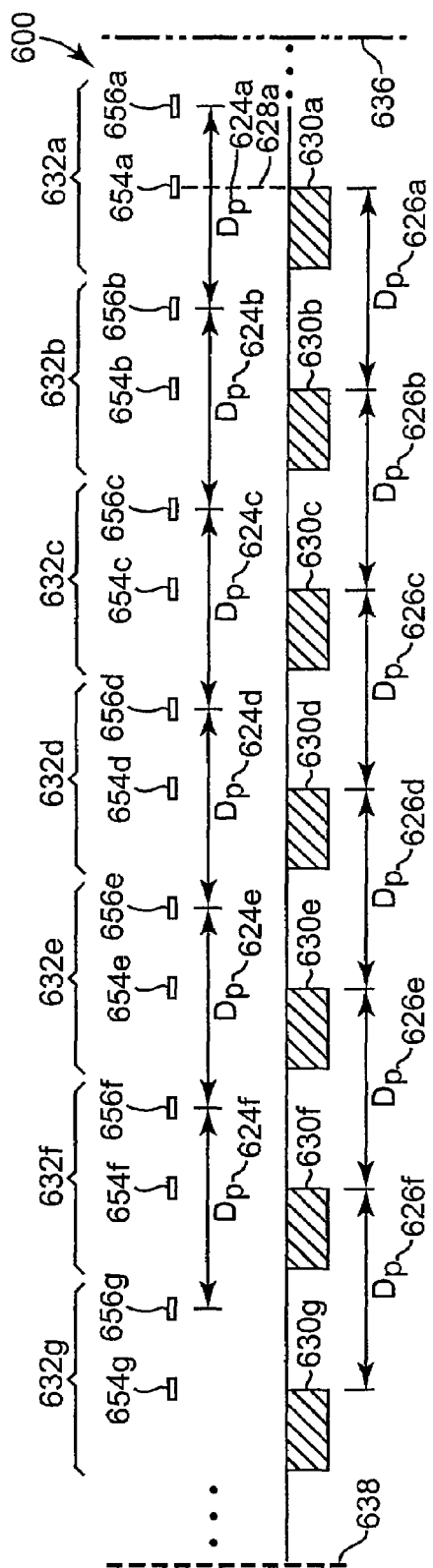
FIG. 14A is a cross-sectional view illustrating portions of a row of pixels according to a conventional configuration.

FIG. 14A is a simplified cross-sectional view of a portion of a row of pixels 600, illustrated as pixels 632a through 632g, extending away from an optical axis 636 toward a peripheral edge 638 of an imaging sensor of which the pixels are a part. Each pixel 632 includes a corresponding sense element 630, PVDD line 654, and BIT line 656. As illustrated by FIG. 14A, row 600 of pixels 632 comprises a conventional configuration wherein a pitch 624 between PVDD and BIT lines 654 and 656 and a pitch 626 between sense elements 630 of consecutive pairs of pixels are equal to a pitch "$D_P$." As such, sense element 630 is at a same position relative to the corresponding PVDD line 654 for each pixel 632, as indicated by dashed line 628a illustrating a substantial alignment between an edge of sense element 630a with PVDD line 654a of pixel 632a.

Figure 14B:
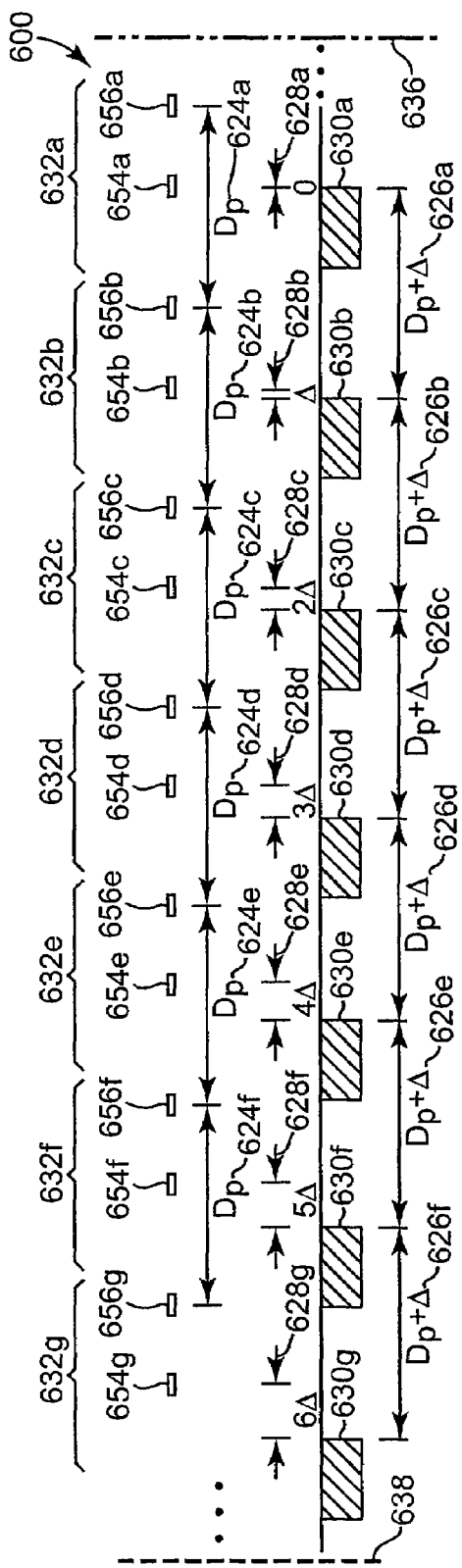
FIG. 14B is a cross-sectional view illustrating portions of a row of pixels configured according to the present invention.

FIG. 14B is a simplified cross-sectional view of the row of pixels 600 according to one embodiment of the present invention. As illustrated, the pitch 626 between sense elements 630 of each consecutive pair of pixels 632 is greater than the pitch 624 between the corresponding PVDD and BIT lines 654 and 656 by an incremental amount Δ. As illustrated, the pitch 624 between PVDD and BIT lines 654 and 656 of consecutive pairs of pixels 632 is indicated as being equal to a pitch distance $D_P$, while the pitch 626 between sense elements is indicated as being equal to the sum of $D_P$ and the incremental amount Δ.

As a result, beginning with pixel 632b, each sense element 630 is positioned or "offset" from the corresponding PVVD line 654 by an additional incremental amount Δ away from optical axis 636. In other words, while sense element 630a remains substantially aligned with corresponding PVDD line 654a as indicated at 628a (i.e. an offset distance of zero), sense element 630b is offset from PVDD line 654b by an offset distance 628b equal to the incremental amount Δ, sense element 628c is offset from corresponding PVDD line 654c by an offset distance 628c equal to two times the incremental amount Δ (i.e. 2Δ), and so on until sense element 628g of pixel 632g is offset from corresponding PVDD line 654g by a offset distance 628g equal to six times the incremental amount Δ (i.e. 6Δ). As such, the offset distance of sense element 630 from the corresponding PVDD line 654 increases with distance of the pixel 632 from optical axis 636 (and from an optical center of the array).

In the illustrated embodiment of FIG. 14B, the value of the incremental amount Δ is constant such that the offset distances 628 between consecutive pairs of pixels 632 increases in a linear fashion with distance from optical center 636. However, the function of the principle or chief ray angle of bundles of incident light rays (such as bundle of light rays 562a of FIG. 11, for example) incident upon pixels 632 of row 600 versus a distance of sense elements 630 from a surface of the array (such as illustrated by surface 526 in FIG. 11, for example) is generally not a linear function. As a result, in other embodiments of the present invention, the incremental amount Δ may not be a constant value and may increase non-linearly across row 600 with distance from optical center 636 such that offset distances 628 between consecutive pairs of pixels 632 also increases in a non-linear fashion with distance from optical center 636.

Also, imaging arrays are typically configured according to a design grid. For example, in 0.25 micron CMOS, the typical minimum design grid is 0.01 μm. As described above, the amount of offset or "shift" 628 depends on various factors including, for example, the distance of the pixel from the optical center of the array, a distance from the substrate or floor of the pixel and the metal interconnect segments (e.g. PVDD, BIT, TX, and RST lines), and the optics associated with the sensor. With reference to FIG. 14B and assuming a design grid of 0.01 μm, for example, an optimal offset distance 628 for each pixel 632 may not adhere to the design grid. For example, an optimal offset distance 628b for sense element 630b from PVDD line 654b of pixel 632b may be determined to be 0.005 μm, which requires that at least the pitch 626a between sense elements 630a and 630b of pixels 632a and 632b be greater than the pitch 624a between PVDD and BIT lines 654a, 656a and 654b, 656b by an incremental amount Δ of 0.005 μm. Such a distance does not adhere to the 0.01 μm design grid.

Figure 14C:
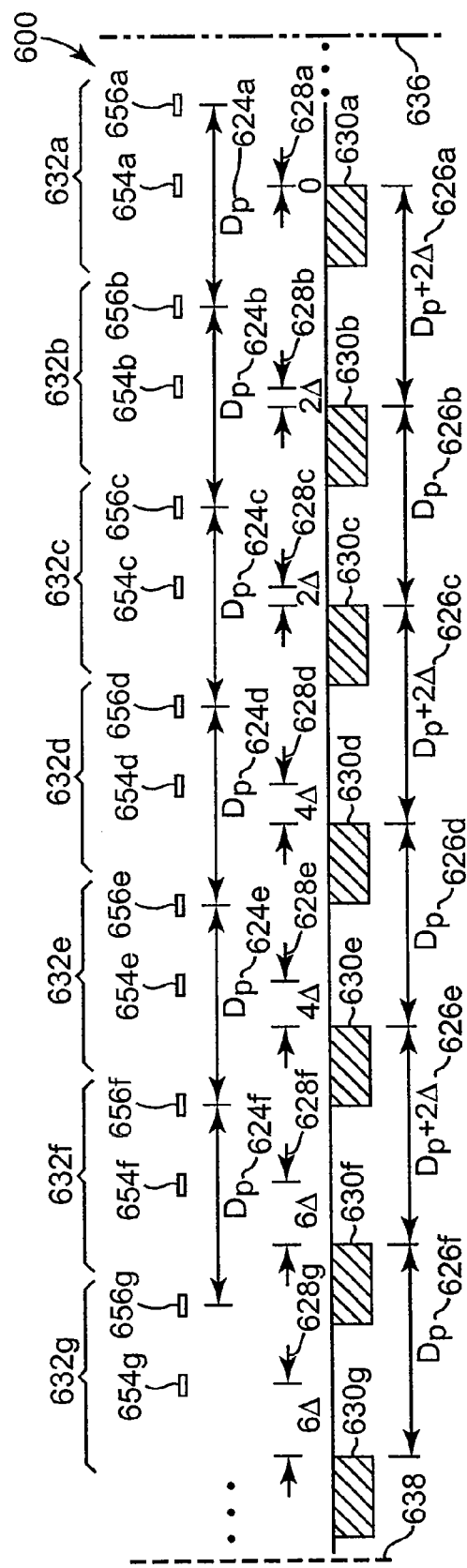
FIG. 14C is a cross-sectional view illustrating portions of a row of pixels configured according to the present invention.

In light of the above, in one embodiment, as illustrated by FIG. 14C, the pitch 626 between consecutive pairs of pixels 632 is adjusted across the array such that the positions of the sense elements 630 align with the design grid. For example, with further reference to FIG. 14B, assume a design grid of 0.01 μm is employed and that a value 0.005 μm is determined as the optimal value for the incremental amount Δ by which the pitch 626 between sense elements should be increased relative to the pitch 624 between PVDD and BIT lines 654 and 656. Based on such an incremental amount Δ, sense element 630 of every other pixel beginning with pixel 632b will not adhere to the 0.01 μm design grid.

As such, with reference to FIG. 14C, the pitch 626 between every other consecutive pair of pixels, beginning with the consecutive pairs of pixels 632a and 632b, is adjusted by twice the incremental amount Δ (i.e. 2Δ), while the pitch 626 between the remaining pairs of consecutive pixels remains at the pitch $D_P$ which is equal to the pitch 524 between PVVD and BIT lines 654, 656. As illustrated, pitches 626b, 626c, and 626e are equal to the sum of the pitch $D_P$ and twice the incremental amount, 2Δ. As a result, groups of adjacent pixels, groups of two adjacent pixels as illustrated, are shifted by a same offset distance 628 from their corresponding PVDD line 654. For example, offset distances 628b and 628c are equal to 2Δ, offset distances 628d, 628e are equal to 4Δ, and offset distances 628f and 628g are equal to 6Δ. As such, sense elements 630 of pixels 632 are positioned further from the corresponding PVDD line 654 with increasing distance from optical axis 636 and each is aligned with the design grid.

Figure 15A:
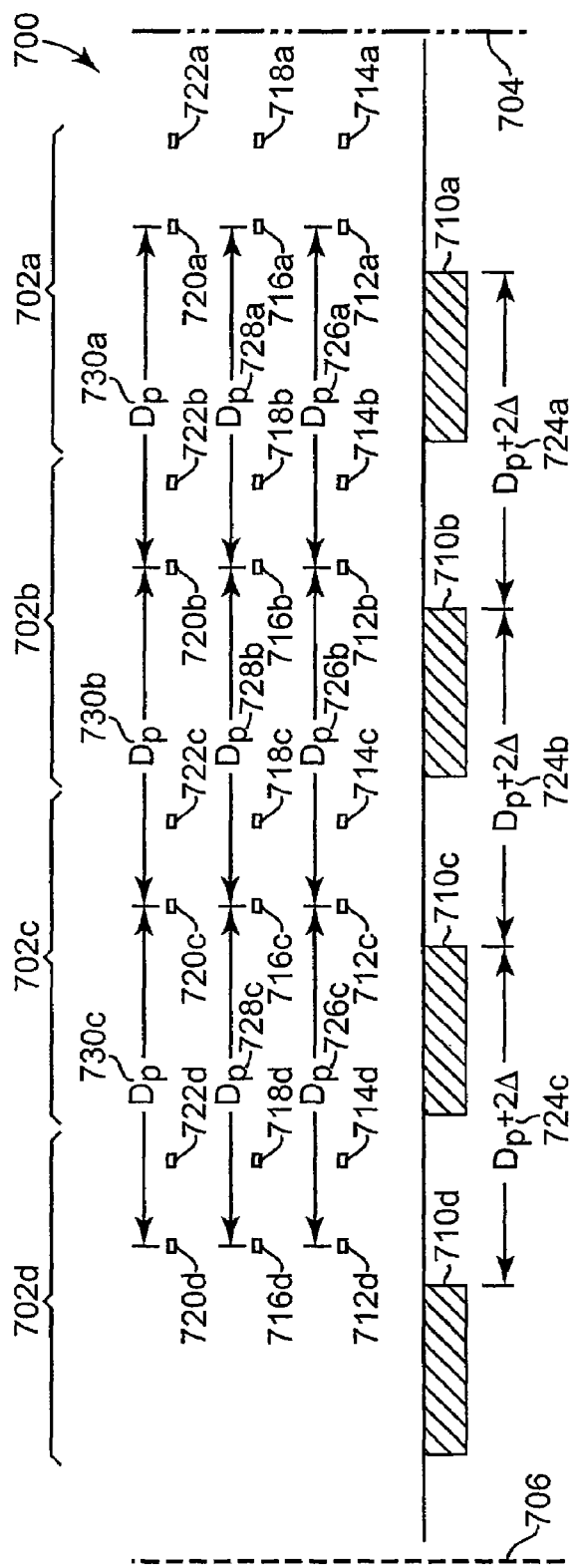
FIG. 15A is a cross-sectional view illustrating portions of a row of pixels configured according to the present invention.
Figure 15B:
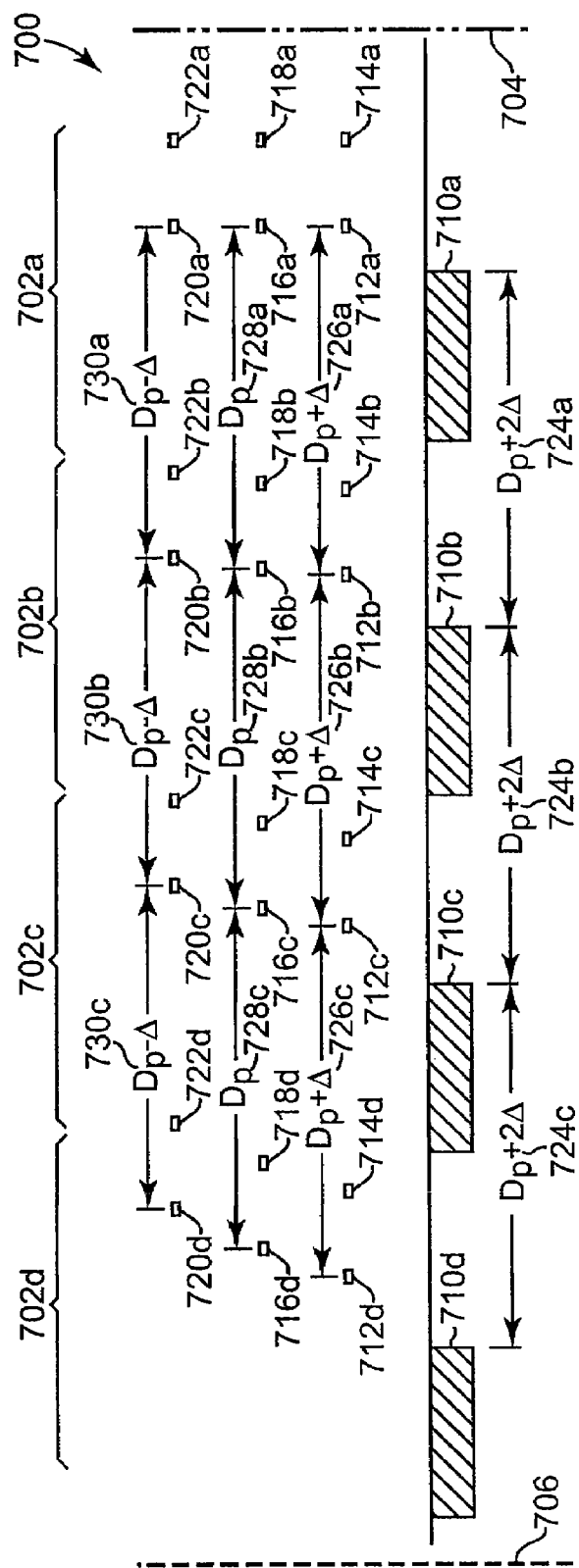
FIG. 15B is a cross-sectional view illustrating portions of a row of pixels configured according to the present invention.

In one embodiment of the present invention, as illustrated by FIGS. 15A and 15B below, increasing a pitch between sense elements as described by FIGS. 10-14C is combined with shifting a portion of the metal interconnect segments closer to an optical center of the array as described by FIGS. 1-9. FIG. 15 is a simplified cross-sectional view of a portion of the array of pixels 700, illustrated as pixels 702a through 702d, extending away from an optical axis 704 toward a peripheral edge 706 of an imaging sensor of which the row of pixels is a part. Each pixel includes a sense element 710, metal one interconnect segments 712 and 714, metal two segments 716 and 718, and metal three interconnect segments 720 and 722, wherein in the interconnect segments provide electrical connectivity for reading and/or resetting operations involving sense elements 710.

As illustrated, row 700 of pixels 702 is configured according to a conventional array structure where each pixel 702 has a substantially identical layout and the pixels are positioned at a fixed pitch. As such, a pitch 724 between sense elements 710, a pitch 726 between metal one interconnect segments 712 and 714, a pitch 728 between metal two interconnect segments 716 and 718, and a pitch 730 between metal three interconnect segments 720 and 722 of consecutive pairs of pixels 702 are each equal to a pitch distance $D_P$.

FIG. 15B illustrates one example layout of row 700 of pixels 702 according to one embodiment of the present invention. As illustrated, pitch 726 between metal two interconnect segments remains at a pitch distance $D_P$, while pitches 726 and 724 between metal one interconnect segments and sense elements 710 are respectively increased by incremental amounts Δ and two times Δ, and pitch 730 between metal three interconnect segments is decreased by the incremental amount Δ. As a result, the structure of each pixel 702 is increasingly "tilted" toward optical axis 704 with increasing distance of the pixel from optical axis 704, thereby reducing shadowing of sense elements 710 by metal one, metal two, and metal three interconnect elements.

Additionally, although described herein primarily with regard to a CMOS buried-gated photodiode type pixel employing three transistors and having metal interconnect segments disposed in two metal layers, the teachings of the present invention can be adapted to apply to other types of CMOS pixel architectures employing varying numbers of transistors and interconnects and more than two metal layers, and to other types of pixels (e.g. CCD type pixels).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An image sensor comprising:
   a substrate;
   at least a first metal layer disposed over the substrate; and
   an array of pixels extending substantially in first and second directions and having an optical center, each pixel having a sense element disposed in the substrate for detecting incoming light and a plurality of associated first metal interconnect segments disposed in the first metal layer,
   wherein for a line of consecutive pixels extending substantially in the first direction in a portion of the array of pixels:
   (i) a first pitch between pairs of consecutive pixels of the line is at least a first distance and increases between consecutive pairs of pixels of the line towards a peripheral edge of the array,
   (ii) a second pitch between the corresponding ones of the associated first metal interconnect segments is equal to the first distance, and
   (iii) a dimension of each sense element of the line is uniformly increased in the first direction.

2. An image sensor comprising:
   a substrate;
   at least a first metal aver disposed over the substrate; and
   an array of pixels extending substantially in first and second directions and having an optical center, each pixel having a sense element disposed in the substrate and a plurality of associated first metal interconnect segments disposed in the first metal layer,
   wherein for a line of consecutive pixels extending substantially in the first direction in a portion of the array of pixels: (i) a first pitch between pairs of consecutive pixels of the line is at least a first distance and increases between consecutive pairs of pixels of the line towards a peripheral edge of the array and (ii) a second pitch between the corresponding ones of the associated first metal interconnect segments is equal to the first distance,
   wherein the first pitch increases in distance between the consecutive pairs of pixels toward the peripheral edge of the array by a constant distance.

3. The image sensor of claim 1, wherein a pitch between sense elements of the consecutive pairs of pixels of the line is equal to the first pitch.

4. The image sensor of claim 1, wherein:
   each pixel of the array of pixels includes an isolation region for isolating each respective pixel from an adjacent pixel; and
   a pitch between isolation regions of the consecutive pairs of pixels of the line is equal to the first pitch.

* * * * *